(12) United States Patent
Okada et al.

(10) Patent No.: US 6,571,469 B2
(45) Date of Patent: Jun. 3, 2003

(54) METHOD FOR MANUFACTURING MODULAR BOARD

(75) Inventors: Masanobu Okada, Sagamihara (JP); Kazuyoshi Nakaya, Yokohama (JP); Hiroyuki Nakaji, Yokohama (JP); Hirofumi Doi, Sagamihara (JP); Iku Nagai, Shiga-ken (JP); Junichi Nakasone, Yokohama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 28 days.

(21) Appl. No.: 09/844,245

(22) Filed: Apr. 26, 2001

(65) Prior Publication Data

US 2002/0029905 A1 Mar. 14, 2002

(30) Foreign Application Priority Data

Apr. 26, 2000 (JP) ........................................ 2000-125871

(51) Int. Cl.⁷ ................................................. H01K 3/10
(52) U.S. Cl. .......................... 29/852; 29/825; 29/811; 29/412; 29/413
(58) Field of Search .......................... 29/852, 825, 411, 29/412, 413, 414

(56) References Cited

U.S. PATENT DOCUMENTS

| 3,653,411 A | * | 4/1972 | Mosher et al. ............. 140/92.1 |
| 5,014,415 A | * | 5/1991 | Okada .......................... 29/412 |
| 6,145,186 A | * | 11/2000 | Beavers ..................... 29/25.35 |
| 6,263,565 B1 | * | 7/2001 | Gotoh et al. ................. 174/262 |
| 6,324,068 B1 | * | 11/2001 | Shimizu et al. ............. 174/255 |

* cited by examiner

*Primary Examiner*—Timothy V. Eley
*Assistant Examiner*—Alvin J. Grant
(74) *Attorney, Agent, or Firm*—Keating & Bennett, LLP

(57) ABSTRACT

A blanking plate is attached to the bottom surfaces of a split board and a remaining board, which are separated from one bare board. After depositing solder paste on a back electrode of the split board, a solder ball is attached on the solder paste. The split board is then heated to melt the solder ball. The molten solder flows along the back electrode and an edge electrode into a through-hole. A portion of the molten solder swells out of the bottom surface of the bare board, and solidifies and bonds to the back electrode and the edge electrode.

23 Claims, 26 Drawing Sheets

FIG. 25
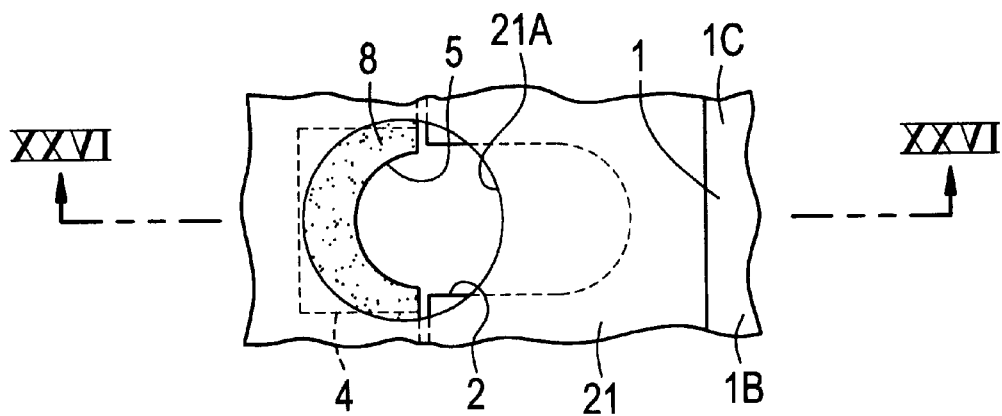
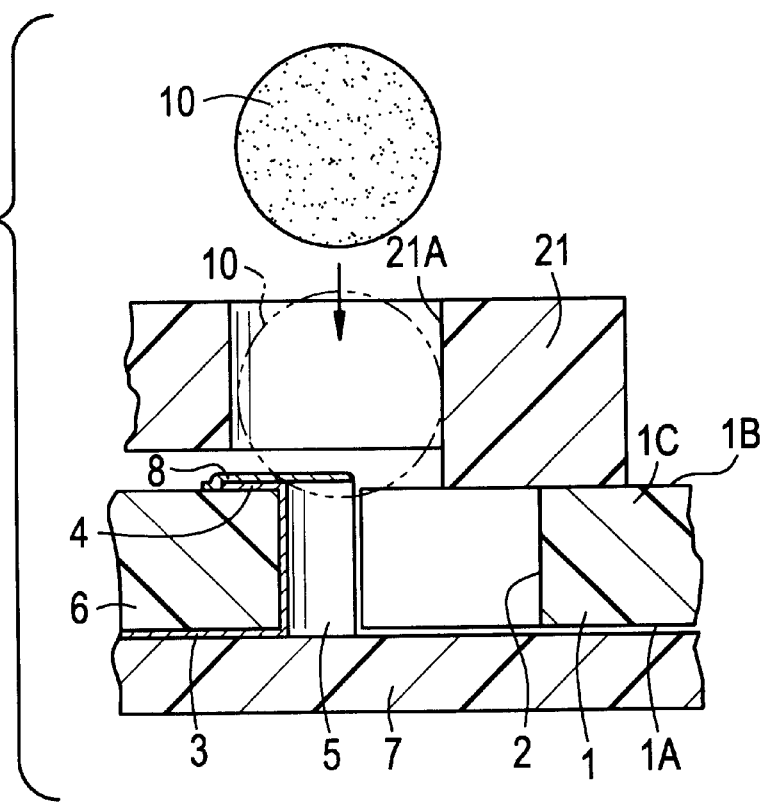
FIG. 26

METHOD FOR MANUFACTURING MODULAR BOARD

BACKGROUND OF THE INVENTION

1. Field of the Invention

The present invention relates to a method for manufacturing a modular board to be electrically connected to a mother board via soldering.

2. Description of the Related Art

In order to achieve high-density design, current electrical circuits are partially assembled into a modular board to facilitate intermediate inspection and mounting, and the modular board is then mounted on a mother board (as disclosed in Japanese Unexamined Patent Application Publication No. 63-204693).

Such conventional modular boards include a rectangular and thin insulator board which is fabricated by alternately laminating insulation resin materials and conductive wiring patterns.

Mounted on the modular board are active elements such as transistors, and passive elements such as resistors and capacitors. These elements are interconnected by a wiring pattern and define an electrical circuit. The end surface portion of the edge of the modular board has a plurality of end surface through holes which are filled with edge electrodes for feeding power from a mother board external to the electrical circuit and inputting and outputting signals to and from the electrical circuit.

The modular board thus includes a modularized electrical circuit assembled thereon for performing a desired signal process on signals input from the mother board. During assembly, the modular board is stacked on the mother board, and the edge electrodes are connected to electrical pads on the mother board using soldering to mount the modular board on the mother board.

The above-referenced modular board is fabricated by alternately laminating rectangular insulators of resin material and conductive wiring patterns.

Since a thermal expansion ratio is different between the resin material of the board and the wiring, the board partially suffers from distortion such as warpage depending on the layout and density of the wiring pattern when the board is heated during the process of the board or during the soldering of the board.

In the conventional art, the modular board is often partially separated from the mother board due to warpage when the modular board is mounted on the mother board. The warpage of the modular board leads to a connection failure on some of the edge electrodes, thereby deteriorating the reliability of the modular board. The conventional modular board is configured to be as thin as possible, and is thus subject to increased warping even under a slight degree of heating. Therefore, it is difficult to reliably mount the modular board onto the mother board.

SUMMARY OF THE INVENTION

To overcome the above-described problems with the prior art, preferred embodiments of the present invention provide a method of manufacturing a modular board which enables edge electrodes to be securely connected to a mother board even when the modular board is subject to warpage.

One preferred embodiment of the present invention provides a method for manufacturing a modular board and includes the steps of opening a through-hole in a bare board, providing a back electrode surrounding the through-hole on the bottom surface of the bare board, arranging an edge electrode, connected to the back electrode, partially or entirely on the inner wall of the through-hole, cutting the bare board along the through-hole to produce a split board having the back electrode and the edge electrode and a remaining bare board, providing an adhesive compound containing an oxide removal substance on the periphery of the through-hole, attaching solid solder to the adhesive compound, heating the split board and the remaining bare board to melt the solid solder, and cooling and solidifying the molten solder on the edge electrode and the back electrode for bonding.

The split board having the back electrode and the edge electrode and the remaining bare board are preferably formed from the bare board. By placing the split board back into the remaining bare board, the through-hole is again provided between the split board and the remaining bare board. In this way, the split board is separated from the bare board prior to attaching the solid solder to the edge electrode.

The solid solder is held in position by the adhesive compound because the adhesive compound containing the oxide removal substance is provided around the through-hole followed by the placement of the solid solder on the adhesive compound. When the split board and the remaining bare board are heated, the adhesive compound acts as a catalyst, and the solid solder starts melting at the portion thereof in contact with the adhesive compound and flows into the through-hole. Since the edge electrode is provided in the through-hole, the molten solder securely attaches to the edge electrode. A portion of the molten solder flows from the edge electrode and covers the back electrode.

Since the molten solder has a substantially spherical shape and surface tension and attaches to the edge electrode and the back electrode, a portion of the molten solder swells and expands out of the through-hole. When the split board, which has already been cut from the bare board, is separated from the bare board, the split board becomes a modular board, and the molten solder swells from the bottom surface thereof toward the mother board. The swollen solder is drawn into a gap between the modular board and the mother board, thereby securely connecting the edge electrodes of the modular board to the electrical pads of the mother board.

Another preferred embodiment of the present invention provides a method for manufacturing a modular board and includes the steps of providing a back electrode on the bottom surface of a bare board, opening a through-hole in the bare board in the back electrode, arranging an edge electrode, connected to the back electrode, partially or entirely on the inner wall of the through-hole, cutting the bare board along the through-hole to produce a split board having the back electrode and the edge electrode and a remaining bare board, providing an adhesive compound containing an oxide removal substance on the periphery of the through-hole, attaching solid solder to the adhesive compound, heating the split board and the remaining bare board to melt the solid solder, and cooling and solidifying the molten solder on the edge electrode and the back electrode for bonding.

The method for manufacturing a modular board preferably includes the step of removing the back electrode on the bottom surface of a portion of the bare board becoming the remaining bare board and the edge electrode on the inner wall of the through-hole of the portion of the bare board becoming the remaining bare board, prior to the cutting of the bare board.

This arrangement prevents the molten solder from sticking to the remaining bare board. After the molten solder is cooled and solidified, the split board is easily separated from the remaining bare board.

The adhesive compound is preferably provided, on the top surface of the split board, in contact with the edge electrode.

When the split board is heated with the solid solder attached to the adhesive compound, the solid solder begins melting at the portion thereof in contact with the adhesive compound. Since the adhesive compound remains in contact with the edge electrode, the molten solder attaches to the edge electrode while partially flowing along the edge electrode to cover the back electrode. As a result, the solder bonds to both the edge electrode and the back electrode.

The adhesive compound is preferably provided on the bottom surface of the split board and in contact with the back electrode.

When the split board is heated with the solid solder attached to the adhesive compound, the solid solder begins melting at the portion thereof in contact with the adhesive compound. Since the adhesive compound remains in contact with the back electrode, the molten solder attaches to the back electrode while partially flowing along the back electrode to reach the edge electrode. As a result, the solder bonds to both the edge electrode and the back electrode.

The adhesive compound is preferably provided in the vicinity of the through-hole on one of the top surface and the bottom surface of the remaining bare board.

When the split board is heated with the solid solder attached to the adhesive compound, the solid solder starts melting at the portion thereof in contact with the adhesive compound. Since the adhesive compound remains in the vicinity of the opening of the through-hole, the molten solder spreads over the opening while, at the same time, flowing into the through-hole. The molten solder is in contact with and attaches to the edge electrode within the through-hole while partially flowing along the edge electrode and reaching the back electrode. As a result, the solder bonds to both the edge electrode and the back electrode.

The solid solder is preferably attached onto the adhesive compound with the through-hole blocked.

This arrangement allows the molten solder to flow into the through-hole when the solid solder becomes molten through heating. The solder thus reliably bonds to the edge terminal within the through-hole.

Another preferred embodiment of the present invention provides a method for manufacturing a modular board and includes the steps of opening a through-hole in a bare board, providing a back electrode surrounding the through-hole on the bottom surface of the bare board, arranging an edge electrode, connected to the back electrode, partially or entirely on the inner wall of the through-hole, cutting the bare board along the through-hole to form a split board having the back electrode and the edge electrode and a remaining bare board, attaching solid solder onto the edge electrode, providing an adhesive compound containing an oxide removal substance onto the solid solder prior to or subsequent to the attachment of the solid solder, heating the split board and the remaining bare board to melt the solid solder, and cooling and solidifying the molten solder on the edge electrode and the back electrode for bonding.

When the split board is heated with the solid solder attached onto the edge electrode, the solid solder attaches to the edge electrode while becoming molten. The molten solder partially flows along the edge electrode, thereby covering the back electrode. As a result, the solder bonds to both the edge electrode and the back electrode.

Yet another preferred embodiment of the present invention provides a method for manufacturing a modular board and includes the steps of providing a back electrode on the bottom surface of a bare board, opening a through hole in the bare board in the back electrode, arranging an edge electrode, connected to the back electrode, partially or entirely on the inner wall of the through-hole, cutting the bare board along the through-hole to produce a split board having the back electrode and the edge electrode and a remaining bare board, attaching solid solder to the edge electrode, providing an adhesive compound containing an oxide removal substance on the solid solder prior to or subsequent to the attachment of the solid solder, heating the split board and the remaining bare board to melt the solid solder, and cooling and solidifying the molten solder on the edge electrode and the back electrode for bonding.

Preferably, the method for manufacturing a modular board further includes the step of removing the back electrode on the bottom surface of a portion of the bare board becoming the remaining bare board and the edge electrode on the inner wall of the through-hole of the portion of the bare board becoming the remaining bare board, prior to cutting the bare board.

This arrangement prevents the molten solder from sticking to the remaining bare board. After the molten solder is cooled and solidified, the split board is easily separated from the remaining bare board.

Preferably, the solid solder blocks the through-hole or is accommodated in the through-hole.

The solid solder is thus securely held in position by the through-hole. When the solid solder is melted, the molten solder easily attaches to the edge electrode arranged in the inner wall of the through-hole.

A further preferred embodiment of the present invention provides a method for manufacturing a modular board and includes the steps of opening a through-hole in a bare board, providing a back electrode surrounding the through-hole on the bottom surface of the bare board, arranging an edge electrode, connected to the back electrode, on the inner wall of the through-hole, partially removing the inner wall of the through-hole to form a slit to form a pre-split board including the edge electrode and the back electrode, the pre-split board being surrounded by the slit, providing an adhesive compound containing an oxide removal substance on the periphery of the edge electrode, attaching solid solder to the adhesive compound, heating the pre-split board and the remaining bare board to melt the solid solder, cooling and solidifying the molten solder on the edge electrode and the back electrode for bonding, and thereafter separating the pre-split board as the modular board from the bare board at the position of the slit.

The pre-split board having the edge electrode and the back electrode is produced by forming the slit in the bare board. The solid solder is held in position by the adhesive compound because the adhesive compound containing the oxide removal substance is provided around the edge electrode followed by the placement of the solid solder on the adhesive compound. When the split board and the remaining bare board are heated, the adhesive compound acts as a catalyst, and the solid solder starts melting at the portion thereof in contact with the adhesive compound and flows into the through-hole. Since the edge electrode is mounted in the through-hole, the molten solder attaches to the edge electrode. A portion of the molten solder flows from the edge electrode to cover the back electrode. Since the molten solder has a substantially spherical shape with surface tension and attaches to the edge electrode and the back electrode, a portion of the molten solder swells out of the through-hole.

Another preferred embodiment of the present invention provides a method for manufacturing a modular board and includes the steps of providing a back electrode on the bottom surface of a bare board, opening a through-hole in the bare board in the back electrode, arranging an edge electrode, connected to the back electrode, on the inner wall of the through-hole, partially removing the inner wall of the through-hole to form a slit to produce a pre-split board including the edge electrode and the back electrode, the pre-split board being surrounded by the slit, providing an adhesive compound containing an oxide removal substance on the periphery of the edge electrode, attaching solid solder to the adhesive compound, heating the pre-split board and the remaining bare board to melt the solid solder, cooling and solidifying the molten solder on the edge electrode and the back electrode for bonding, and thereafter separating the pre-split board as the modular board from the bare board at the position of the slit.

The adhesive compound is preferably provided, on the top surface of the pre-split board, in contact with the edge electrode.

When the split board is heated with the solid solder attached to the adhesive compound, the solid solder begins melting at the portion thereof in contact with the adhesive compound. Since the adhesive compound then remains in contact with the back electrode, the molten solder attaches to the back electrode while partially flowing along the back electrode to cover the edge electrode. As a result, the solder solidifies and bonds to both the edge electrode and the back electrode.

The adhesive compound is preferably provided, on the bottom surface of the pre-split board, in contact with the back electrode.

When the split board is heated with the solid solder attached to the adhesive compound, the solid solder begins melting at the portion thereof in contact with the adhesive compound. Since the adhesive compound remains in contact with the back electrode, the molten solder attaches to the back electrode while partially flowing along the back electrode to cover the edge electrode. As a result, the solder solidifies and bonds to both the edge electrode and the back electrode.

The solid solder is preferably attached to the adhesive compound at a location corresponding to the edge electrode with the slit partially blocked.

When the solid solder is melted via heating, the molten solder enters into the slit at the location corresponding to the edge electrode. The solder reliably attaches to the edge electrode exposed within the slit.

Still another preferred embodiment of the present invention provides a method for manufacturing a modular board and includes the steps of opening a through-hole in a bare board, providing a back electrode surrounding the through-hole on the bottom surface of the bare board, arranging an edge electrode, connected to the back electrode, on the inner wall of the through-hole, partially removing the inner wall of the through-hole to cause a slit to form a pre-split board including the edge electrode and the back electrode, the pre-split board being surrounded by the slit, attaching solid solder to the edge electrode, providing an adhesive compound containing an oxide removal substance onto the solid solder prior to or subsequent to the attachment of the solid solder, heating the pre-split board and the remaining bare board to melt the solid solder, cooling and solidifying the molten solder on the electrode and the back electrode, and thereafter separating the pre-split board as the modular board from the bare board at the position of the slit.

When the pre-split board is heated with the solid solder attached to the adhesive compound, the solder attaches to the edge electrode while being melted. The molten solder flows along the edge electrode and covers the back electrode. As a result, the solder solidifies and bonds to both the edge electrode and the back electrode.

Yet another preferred embodiment of the present invention provides a method for manufacturing a modular board and includes the steps of providing a back electrode on the bottom surface of a bare board, opening a through-hole in the bare board in the back electrode, arranging an edge electrode, connected to the back electrode, on the inner wall of the through-hole, partially removing the inner wall of the through-hole to make a slit to form a pre-split board including the edge electrode and the back electrode, the pre-split board being surrounded by the slit, attaching solid solder onto the edge electrode, providing an adhesive compound containing an oxide removal substance onto the solid solder prior to or subsequent to the attachment of the solid solder, heating the pre-split board and the remaining bare board to melt the solid solder, cooling and solidifying the molten solder on the edge electrode and the back electrode, and thereafter separating the pre-split board as the modular board from the bare board at the position of the slit.

Preferably, the solid solder partially blocks the slit at a location corresponding to the edge electrode, or is accommodated within the slit at a location corresponding to the edge electrode.

The solid solder is thus securely held in position by the slit. When the solid solder melts, the molten solder easily attaches to the edge electrode arranged in the inner wall of the slit.

Another preferred embodiment of the present invention provides a method for manufacturing a modular board and includes the steps of opening a through-hole in a bare board, providing a back electrode surrounding the through-hole on the bottom surface of the bare board, arranging an edge electrode, connected to the back electrode, partially or entirely on the inner wall of the through-hole, providing an adhesive compound containing an oxide removal substance on the periphery of the through-hole, attaching solid solder to the adhesive compound, heating the bare board to melt the solid solder, cooling and solidifying the molten solder on the edge electrode and the back electrode, and thereafter cutting the bare board at the position of the through-hole to separate the modular board.

When the bare board is heated with the solid solder attached to the adhesive compound, the adhesive compound acts as a catalyst, and the solid solder begins melting at the portion thereof in contact with the adhesive compound and flows into the through-hole. Since the edge electrode is mounted in the through-hole, the molten solder attaches to the edge electrode. A portion of the molten solder flows from the edge electrode and covers the back electrode.

Since the molten solder has a substantially spherical shape with surface tension and attaches to the back electrode, a portion of the molten solder swells out of the through-hole. When the modular board is formed by cutting the bare board, the swollen solder fills a gap between the modular board and the mother board, thereby connecting the edge electrodes of the modular board to the electrical pads of the mother board.

Another preferred embodiment of the present invention provides a method for manufacturing a modular board and includes the steps of providing a back electrode on the bottom surface of a bare board, opening a through-hole in the bare board in the back electrode, arranging an edge electrode, connected to the back electrode, partially or entirely on the inner wall of the through-hole, providing an adhesive compound containing an oxide removal substance on the periphery of the through-hole, attaching solid solder to the adhesive compound, heating the bare board to melt the solid solder, cooling and solidifying the molten solder on the edge electrode and the back electrode, and thereafter cutting the bare board at the position of the through-hole to separate the modular board.

Preferably, the method for manufacturing a modular board according to this preferred embodiment further includes the step of removing the back electrode on the bottom surface of a portion of the bare board becoming the remaining bare board and the edge electrode on the inner wall of the through-hole of the portion of the bare board becoming the remaining bare board, prior to the providing of the adhesive compound.

This arrangement prevents the molten solder from sticking to the remaining bare board other than the modular board subsequent to the cutting. When the molten solder is cooled and solidified, the split board is easily separated from the remaining bare board without the need for cutting the solder bonded to the edge electrode.

Preferably, the adhesive compound is one of a flux and a solder paste including a powdered solder and a flux, and the solid solder is a spherical solder ball which is solidified from a brazing alloy.

With the flux or the solder paste, the solder ball is held in position and solder melting is expedited. When the flux is used, the volume of the molten solder ball is maintained, and the dimension of the bump from the bottom surface of the board is constant. When the solder paste is used, the solder ball is melted together with the solder paste. The molten solder ball together with solder in the solder paste solidifies and bonds to both the edge electrode and the back electrode.

Other features, elements, characteristics and advantages of the present invention will become apparent from the detailed description of preferred embodiments thereof with reference to the attached drawings.

BRIEF DESCRIPTION OF THE DRAWINGS

FIG. 25 is an enlarged view of a bare board with a jig attached thereto in a solder ball placement step in a manufacturing method of a second preferred embodiment of the present invention.

FIG. 26 is a sectional view of the bare board taken along line XXVI—XXVI in FIG. 25.

DETAILED DESCRIPTION OF PREFERRED EMBODIMENTS

Figure 1:
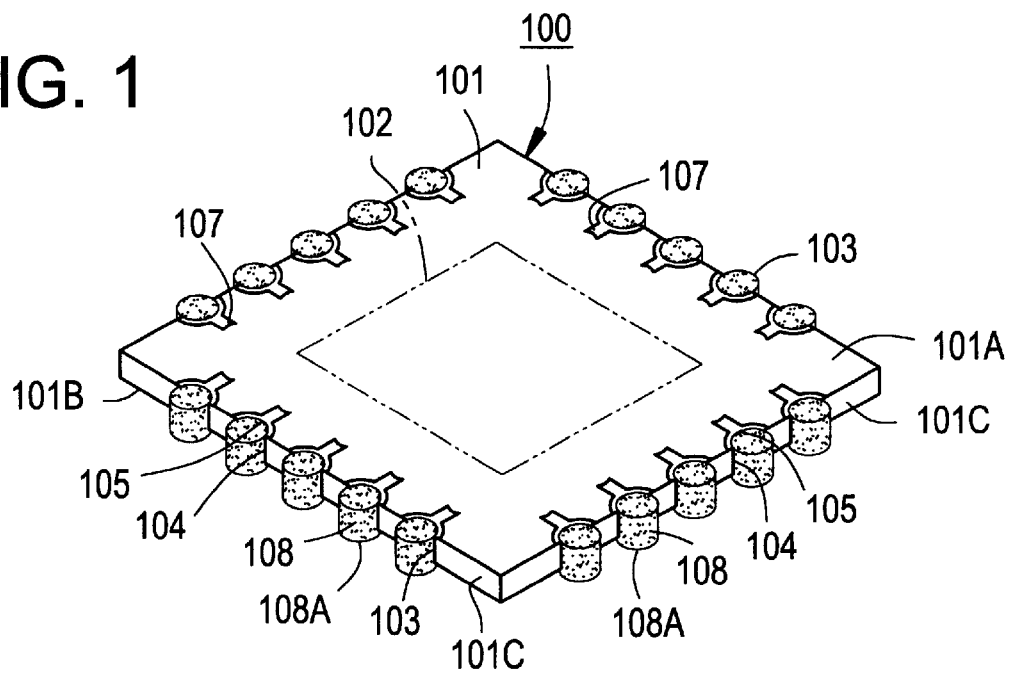
FIG. 1 is a perspective view of a modular board that has been manufactured according to a manufacturing method of a first preferred embodiment of the present invention.
Figure 2:
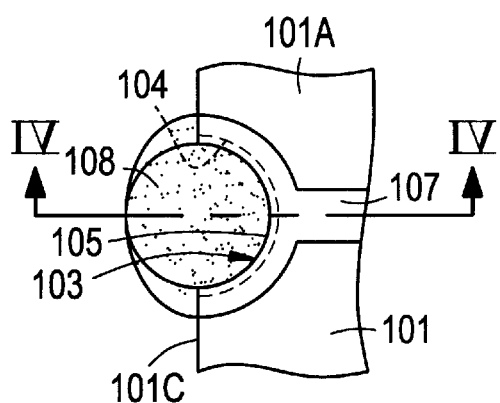
FIG. 2 is a plan view showing an edge through-hole of FIG. 1.
Figure 3:
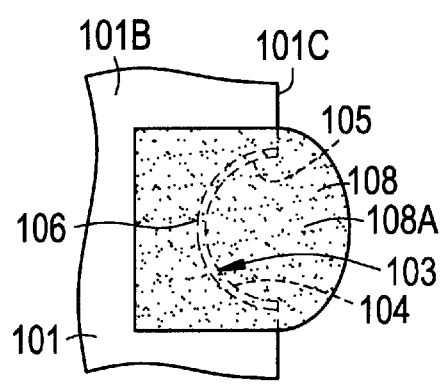
FIG. 3 is a bottom view showing the edge through-hole of FIG. 1.
Figure 59:
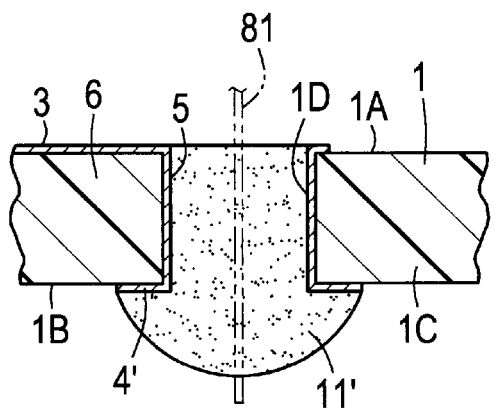
FIG. 59 is a sectional view showing the bare board which is being cut by a diamond cutter after solder has been solidified and bonded to an edge electrode on the inner wall of a through-hole in the manufacturing method of a modification of the ninth preferred embodiment of the present invention.

Preferred embodiments of the present invention for manufacturing a modular board are described below with reference to in FIG. 1 through FIG. 59.

A method of manufacturing a modular board in accordance with a first preferred embodiment of the present invention is discussed, referring to FIG. 1 through FIG. 22. FIGS. 1 through 4 show a modular board produced by the manufacturing method of the first preferred embodiment.

As shown, a substantially rectangular modular board 100 includes a board 101, through-holes 103, and solder fillets 108.

The board 101, defined by alternately laminating insulation resin materials and wiring patterns (not shown), has a square shape as large as about 30 mm by about 30 mm. The board 101 also has an electronic component 102 (not shown) such as a semiconductor IC, active elements, or passive elements at the approximate center of the top surface 101A of the board. The board 101 is attached to a mother board 109 via the bottom surface 101B. As shown in FIG. 1, the board 101 has four end surfaces 101C around the edge thereof, and edge through-holes 103 are provided at each end surface 101C as will be described below.

The edge through-holes 103 are provided at each of the four end surfaces 101C of the four sides of the board 101 defining an outer periphery. Each edge through-hole 103 is defined by an end surface notch 104, an edge electrode 105, and a back electrode 106.

The end surface notch 104 is open to the end surface 101C of the board 101 in a recessed curve shape. The end surface notch 104 penetrates through the direction of thickness of the board 101, and defines a substantially semicircular opening on the top surface 101A and the bottom surface 101B of the board 101.

The edge electrode 105, provided on the inner wall of the end surface notch 104 and having a substantially hollow semicylindrical configuration, entirely covers the inner wall of the end surface notch 104.

The back electrode 106 extends around the end surface notch 104 on the bottom surface 101B of the board 101. The back electrode 106, having a substantially rectangular shape, is connected to the edge electrode 105.

A wiring 107 connects the edge electrode 105 to the electronic component 102. The wiring 107, extending in a half-ring shape around the edge of the end surface notch 104 formed on the top surface 101A of the board 101, is connected to the edge electrode 105 while extending to the approximate center of the board 101.

The wiring 107 is preferably coated with a resist film (not shown) so that the solder 108 to be discussed later is prevented from sticking to the wiring 107 and from being projected on the top surface 101A of the board 101 when the solder 108 is melted. The wiring 107 is not necessarily provided on the top surface 101A, and may be a wiring pattern laminated in the board 101 to which the edge electrode 105 is connected.

Figure 4:
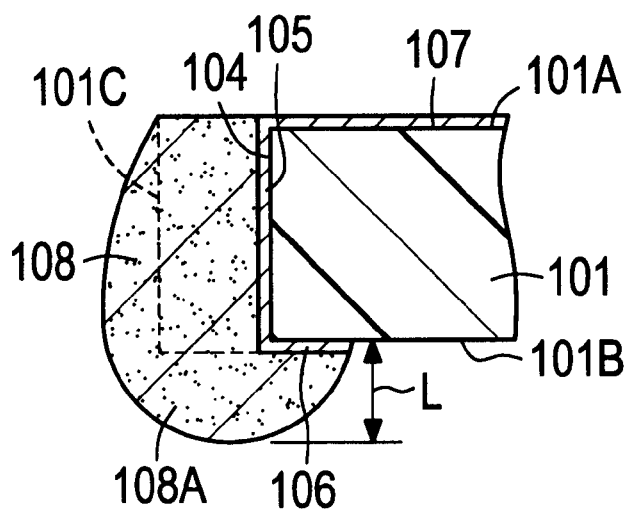
FIG. 4 is a sectional view of the edge through-hole taken along line IV—IV in FIG. 2.

The solder 108 is received in the end surface notch 104 and fixed to the edge electrode 105. The solder 108 has a substantially cylindrical shape and extends in the direction of thickness of the board 101. Referring to FIG. 4, part of the solder 108 covers the back electrode 106 and swells downward from the bottom surface 101B of the board 101 (toward the mother board 109) by a projection dimension L, thereby forming a bump 108A.

Figure 5:
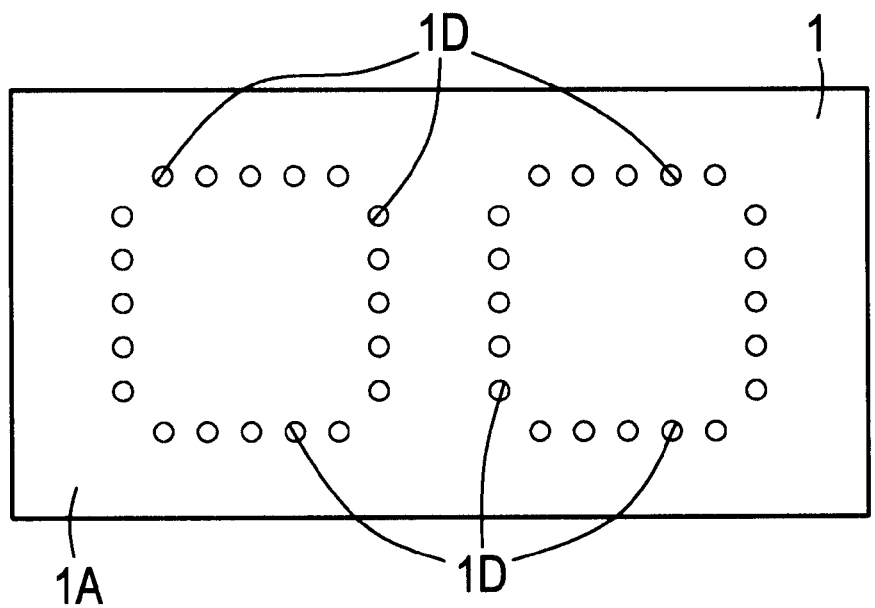
FIG. 5 is a plan view showing a through-hole formation step for opening the through-hole in a bare board in accordance with the first preferred embodiment of the present invention.

The construction of the modular board of the first preferred embodiment has been discussed. The manufacturing method of the modular board of the first preferred embodiment is now discussed, referring to FIG. 5 through FIG. 19B. In accordance with the first preferred embodiment, two modular boards are fabricated from a single bare board as shown in FIG. 5.

In a through-hole formation step shown in FIG. 5, two modular boards are blanked from a bare board 1 using a round blanking die, and a number of preliminary through-holes 1D for arranging edge electrodes 5 therein to be discussed later are punched along the edge of the substantially rectangular shape.

Figure 6:
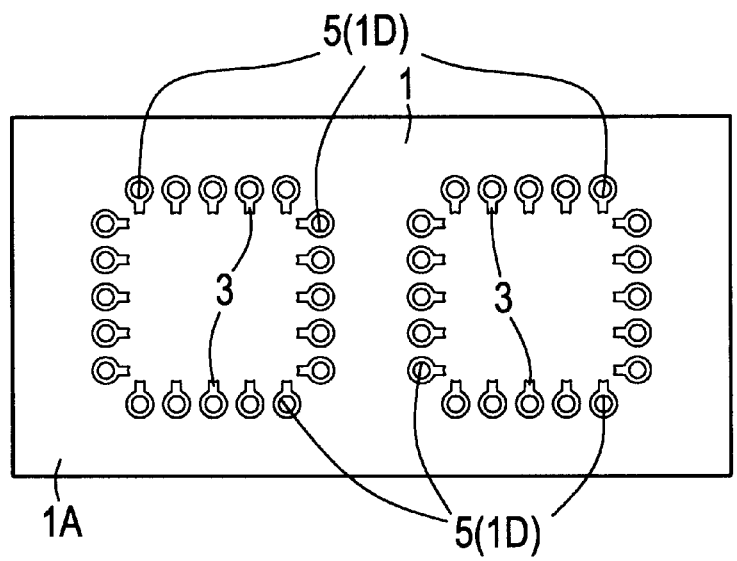
FIG. 6 is a plan view showing an edge electrode formation step for arranging an edge electrode on the inner wall of the through-hole.
Figure 7:
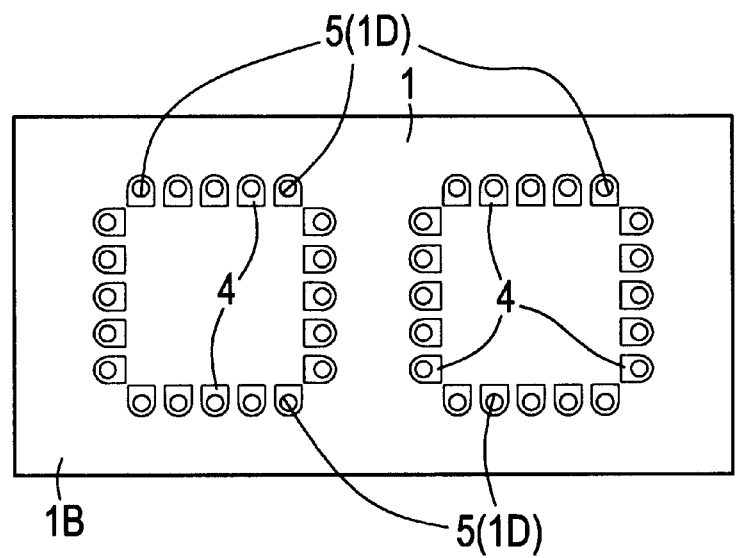
FIG. 7 is a bottom view showing the bare board of FIG. 6.

Referring to an edge electrode formation step with reference to FIG. 6 through FIG. 9, a copper film (not shown) attached beforehand on a top surface 1A and a bottom surface 1B of the bare board 1 is partially removed through an etching process. A wiring 3 extending around a through-hole 2 is formed on the top surface 1A of the bare board 1 as shown in FIG. 6 and FIG. 7, and a back electrode 4 having a generally rectangular shape is formed on the bottom surface 1B of the bare board 1. The back electrode 4 has a larger area than a portion of the wiring 3 extending around the opening of the through-hole 1D. The through-hole 2 of the bare board 1 is then plated to form an edge electrode 5 on the inner wall of the through-hole 1D.

Figure 8:
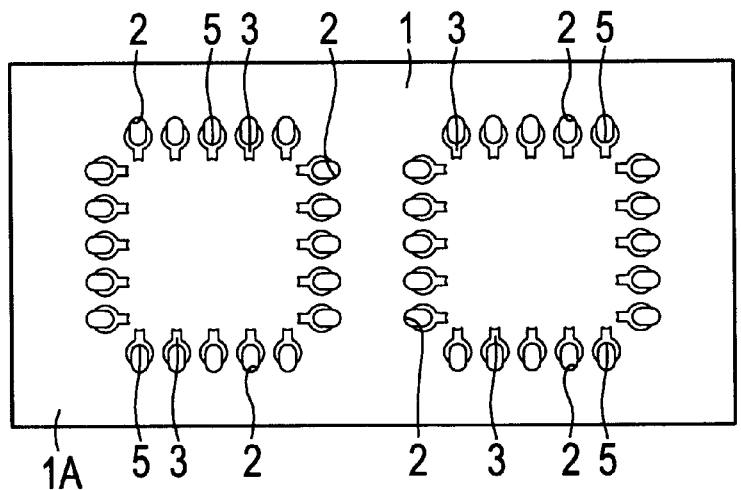
FIG. 8 is a plan view showing an edge electrode removal step for removing a portion of the edge electrode.
Figure 9:
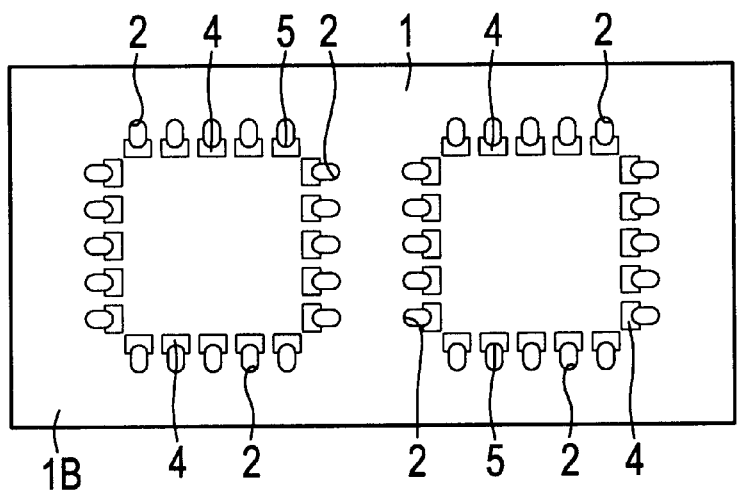
FIG. 9 is a bottom view showing the bare board of FIG. 8.

Referring to an edge electrode removal step shown in FIG. 8 and FIG. 9, a part of the inner wall of the through-hole 1D, which is going to be part of a remaining bare board 1C, is punched using a blanking die, and an oval through-hole 2 is thus formed. A substantially rectangular portion of the bare board 1 surrounded by a ring of a number of through-holes 2 becomes the board 101, and edge electrodes 5 are thus formed on the substantially rectangular portion of the bare board 1. The wiring 3 and the back electrode 4 are also arranged on the substantially rectangular portion of the bare board 1 surrounded by the through-holes 2. The edge electrode 5 is connected to both the wiring 3 and the back electrode 4. On the other hand, the back electrode 4 and the edge electrode 5 are removed from the remaining bare board.

Figure 10:
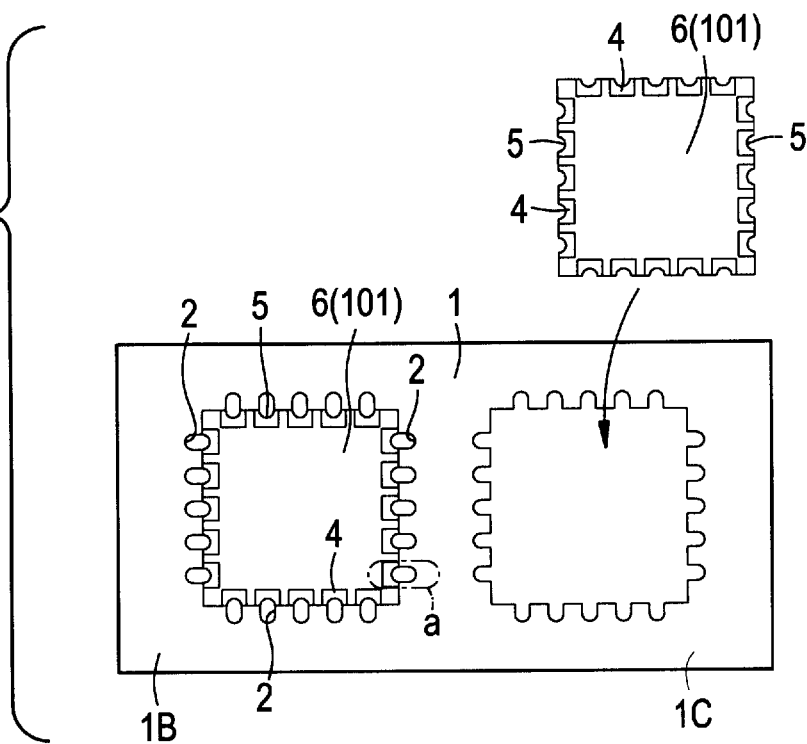
FIG. 10 a bottom view showing a push-back step for placing a split board into a remaining bare board after the split board is separated from the bare board.
Figure 11:
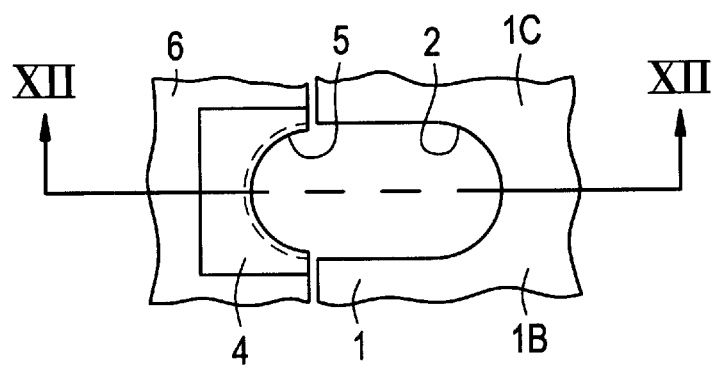
FIG. 11 is an enlarged view showing a portion a in enlargement of FIG. 10.
Figure 12:
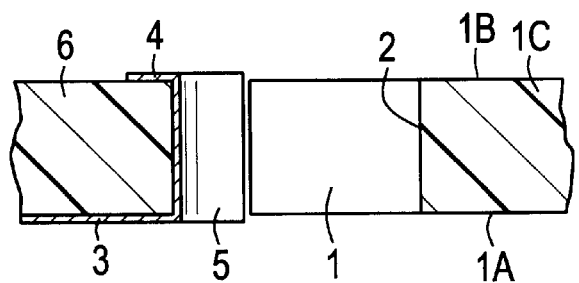
FIG. 12 is a sectional view of the bare board taken along line XII—XII in FIG. 11, with the bare board top side down.

In a push-back step shown in FIG. 10 through FIG. 12, a split board 6, corresponding to the modular board of the board 101 surrounded by the through-holes 2, is blanked and separated from the bare board 1 using a push-back die. Since the split board 6 is blanked from the bare board 1 at the through-holes 2 in this operation, part of the through-hole 2 remains on the split board 6, and stays covered with the edge electrode 5.

After the split board 6 is separated from the bare board 1, the split board 6 is then placed back into the square opening of the remaining bare board 1C. The through-holes 2 are again formed between the split board 6 and the remaining bare board 1C.

Figure 13:
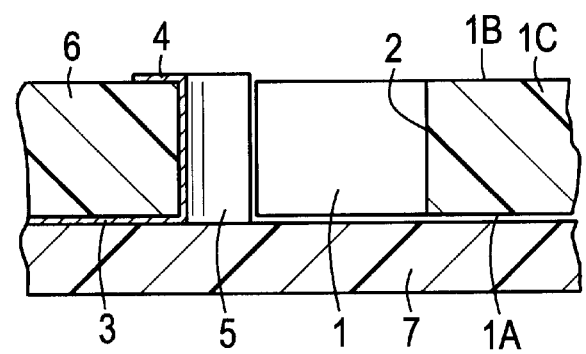
FIG. 13 is a sectional view showing a through-hole blocking step for mounting a blanking plate to the bare board.

In a through-hole blocking step shown in FIG. 13, the bare board 1 is mounted on a blanking plate 7 with the top surface 1A thereof facing the blanking plate 7 (with the bare board 1 upside down). The blanking plate 7 is fabricated of a metal material such as aluminum, or a heat-resistant resin material, to which molten solder is difficult to wet.

Figure 14:
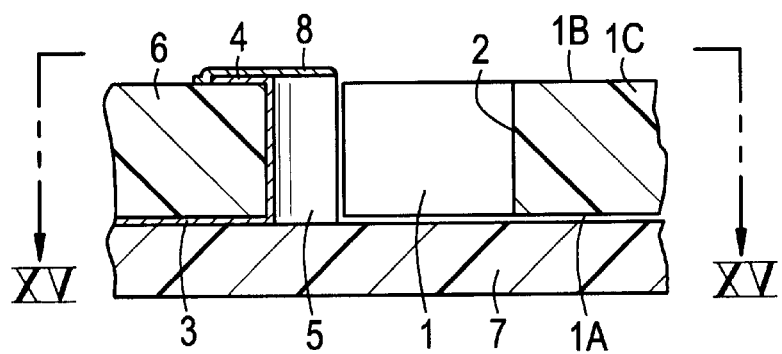
FIG. 14 is a sectional view showing a solder paste deposition step for depositing solder paste over the back electrode.
Figure 15:
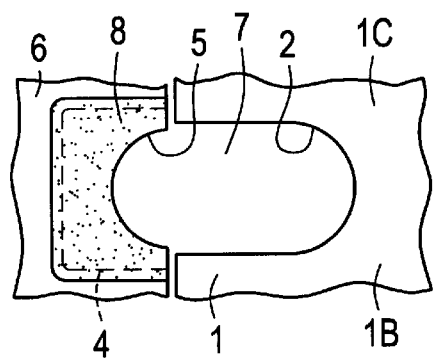
FIG. 15 is an enlarged view of the bare board taken along line XV—XV in FIG. 14.

In a solder paste deposition step shown in FIG. 14 and FIG. 15, a solder paste 8 as an adhesive compound containing an oxide removal substance is provided onto the bottom surface of the split board 6 surrounding the through-hole 2. The solder paste 8 is preferably formed by mixing powdered solder and a flux into a paste. The solder paste 8 may have a shape that is generally a half circle covering the back electrode 4. It suffices to place the solder paste 8 in contact with the back electrode 4, and covering the entire surface of the back electrode 4 with the solder paste 8 is not necessary. The adhesive compound containing an oxide removal substance may be a flux only, instead of the solder paste 8 containing solder and a flux.

Figure 16:
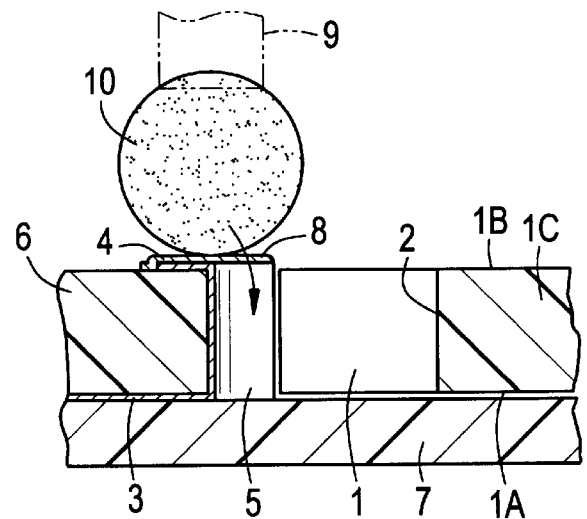
FIG. 16 is a sectional view showing a solder ball placement step for placing a solder ball onto the solder paste.

In a solder ball placement step shown in FIG. 16, a solder ball 10 as solid solder is placed onto the solder paste 8 using a suction-type ball mounter 9. The solder ball 10 then sticks to the solder paste 8. The solder ball 10 is produced by solidifying a brazing alloy into a substantially spherical shape with no flux mixed. Since the solder paste 8 is adhesive, the solder ball 10 is held in position on the back electrode 4 by the solder paste 8.

Figure 17:
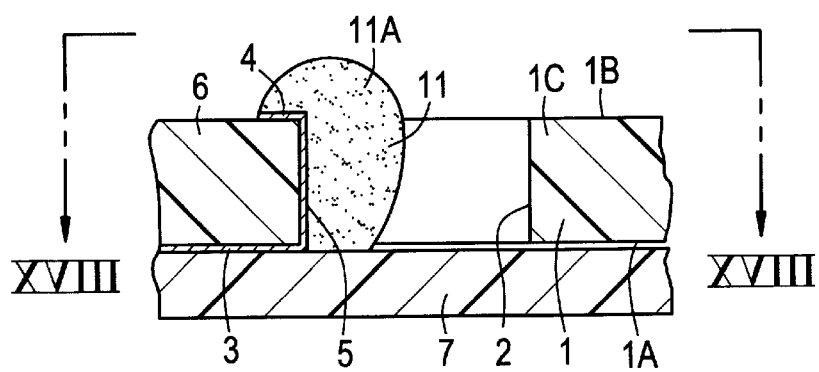
FIG. 17 is a sectional view showing the solder wetting to an edge electrode through heating.
Figure 18:
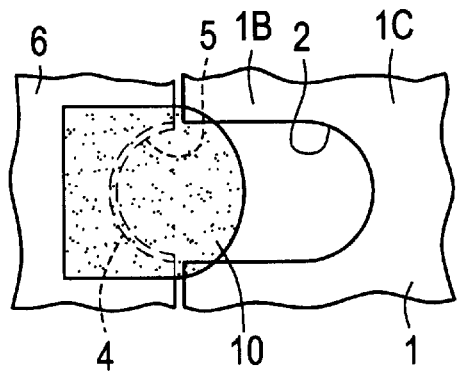
FIG. 18 is an enlarged plan view showing the bare board taken along line XVIII—XVIII in FIG. 17.

In a heating step shown in FIG. 17 and FIG. 18, the split board 6 and the remaining bare board 1C are introduced into a heating furnace. The solder paste 8 is then melted while the flux contained in the solder paste 8 acts as a catalyst. The solder ball 10 starts melting gradually at the portion thereof in contact with the solder paste 8. The molten solder ball 10 together with the solder contained in the solder paste 8 spreads over the back electrode 4, while being drawn to the edge electrode 5 connected to the back electrode 4. The molten solder flows into the through-hole 2 as represented by an arrow shown in FIG. 16, and then attaches to the back electrode 4 and the edge electrode 5.

Because of its tendency to be substantially spherical through surface tension, the molten solder ball 10 swells along the edge electrode 5 in the through-hole 2 out of the bottom surface 1B of the bare board 1. Since the bottom surface 1B of the bare board 1 has the back electrode 4 surrounding the through-hole 2, the molten solder ball 10 is attracted to the back electrode 4, increasing the volume thereof out of the through-hole 2. The molten solder ball 10 covers the back electrode 4, swelling out of the bottom surface 1B.

The heating of the bare board 1 is then stopped in this state. By allowing the bare board 1 to cool, solder 11 solidifies on the edge electrode 5 as shown in FIG. 17. The solder 11 thus forms a bump 11A projecting out of the bottom surface 1B of the bare board 1 toward the mother board 109 to be discussed later.

In the heating step, the split board 6 and other elements is heated in the heating furnace. Alternatively, the split board 6 may be heated by blowing a hot wind, or for heating, the split board 6, the remaining bare board 1C, the blanking plate 7, etc., may be placed on a heated plate.

When the solder 11 is bonded to the back electrode 4 and the edge electrode 5, the electronic component 102 may be mounted on the top surface 1A of the bare board 1. This arrangement results in a better productivity than that in the case when the electronic component 102 is separately mounted.

Figure 19:
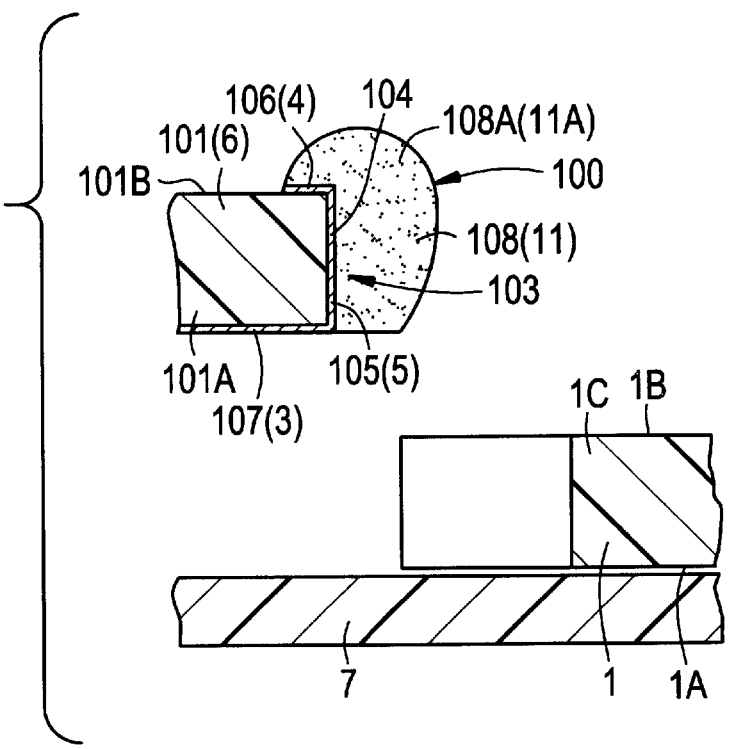
FIG. 19 is a sectional view showing a split board separation step for separating a split board from the bare board.

In a split board separation step shown in FIG. 19, the split board 6, which has been already cut from the bare board 1 in the push-back step, is separated from the remaining bare board 1C. The split board 6 now becomes the board 101, the wiring 3 becomes the wiring 107 on the top surface 101A of the board 101, the back electrode 4 becomes the back electrode 106 arranged on the bottom surface 101B of the board 101, the edge electrode 5 becomes the edge electrode 105 arranged on the end surface 101C of the board 101, and the solder 11 becomes the solder 108 bonded to the edge electrode 105. A modular board 100 with the solder 108 bonded to the edge electrode 105 of the board 101 results.

The manufacturing method of the modular board 100 of the first preferred embodiment has been discussed. The connection of the modular board to the mother board is next discussed.

Figure 20:
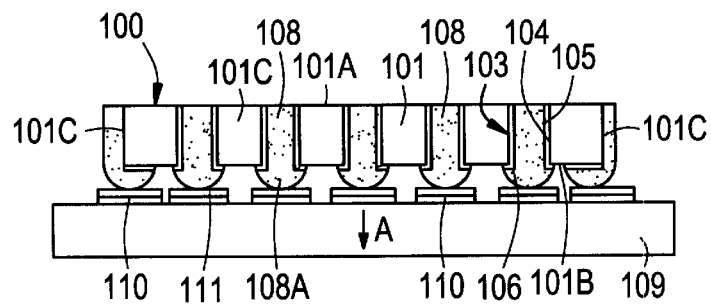
FIG. 20 is a side view showing a modular board in the state thereof mounted on a mother board, wherein the modular board has been manufactured in accordance with the manufacturing method of the first preferred embodiment of the present invention.

The modular board 100 placed on the mother board 109 is first heated. Since the board 101 is a laminate of the insulation resin materials and the wiring patterns, the board 101 suffers from bowing. For example, the board 101 on both ends thereof is lifted from the mother board 109 as shown in FIG. 20, causing a gap between the edge electrode 105 and an electrode pad 110 of the mother board 109.

The solder 108 affixed onto the edge electrode 105 has a bump 108A projecting out of the bottom surface 101B of the board 101. The bump 108 fills the gap between the edge electrode 105 and the electrode pad 110.

The modular board 100 is placed on the mother board 109 with the solder 108 aligned with the electrode pad 110 in position. When the board 101 suffers from bowing as shown in FIG. 20, a majority of solder joints 108 on the central portion of the board 101 remains in contact with the electrode pads 110 while solder joints 108 on both ends of the board 101 are spaced from the electrode pads 110.

When the modular board 100 and the mother board 109 are heated in this state, a solder paste 111 provided beforehand on the electrode pad 110 melts. The solder bump 108 on the approximately central portion of the board 101 is in contact with the solder paste 111, allowing heat to be transferred from the solder paste 111 to the solder bump 108. The solder bumps 108 on the central portion of the board 101 melt earlier than the solder bumps 108 on both ends of the board 101. The board 101 falls with its own weight in the direction represented by an arrow A as shown in FIG. 20.

The solder bumps 108 on both ends of the board 101 are also put into contact with the electrode pads 110 of the mother board 109.

Figure 21:
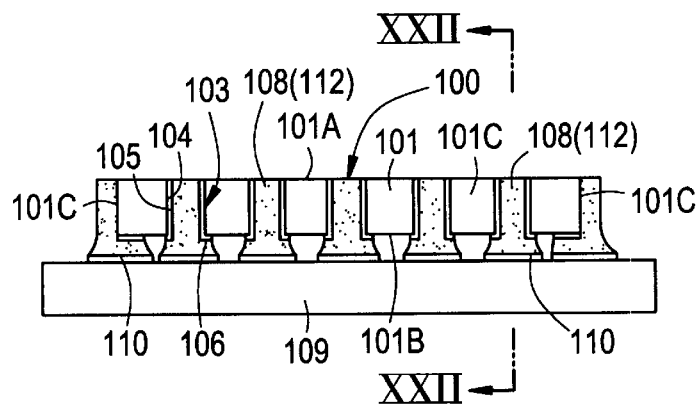
FIG. 21 is a side view showing the modular board of FIG. 20 connected to the mother board.
Figure 22:
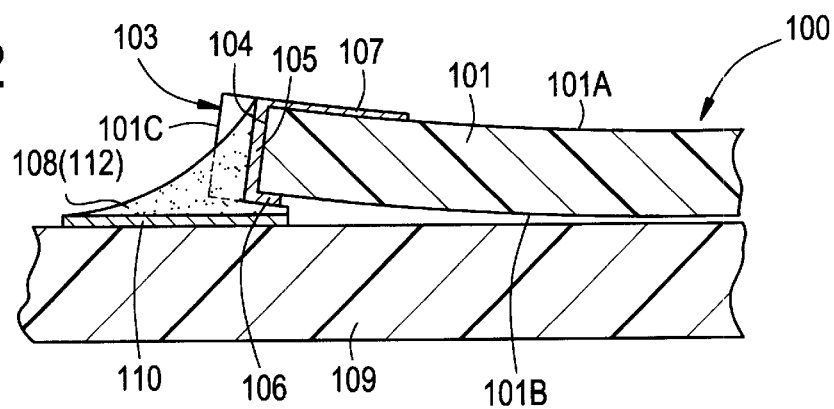
FIG. 22 is a sectional view of the modular board and the mother board taken along line XXII—XXII in FIG. 21.

Even if the board 101 is bowed causing a gap between the edge electrode 105 and the electrode pad 110 as shown in FIG. 21 and FIG. 22, the solder bump 108 projecting out of the bottom surface 101B of the board 101 toward the mother board 109 fills the gap, thereby reliably connecting all edge electrodes 105 to respective electrode pads 110. A solder fillet 112 is thus formed between the edge electrode 105 and the electrode pad 110.

In accordance with the manufacturing method of the modular board of the first preferred embodiment, the solder paste 8 is provided around the through-hole 2 on the bare board 1, the solder ball 10 is placed onto the solder paste 8, and the bare board 1 is then heated. The solder ball 10 is melted on the portion thereof in contact with the solder paste 8, and the molten solder ball 10 is thus introduced into the through-hole 2. The molten solder 10 is then allowed to wet to the edge electrode 5 arranged on the inner wall of the through-hole 2.

Since the solder paste 8 is provided on the back electrode 4 on the bottom surface of the split board 6, the molten solder ball 10 spreads over the back electrode 4 when the solder ball 10 attached on the solder paste 8 is melted. Since the back electrode 4 is connected to the edge electrode 5, the molten solder ball 10 is guided into the through-hole 2. The solder 11 thus reliably solidifies and bonds to the back electrode 4 and the edge electrode 5.

In accordance with the first preferred embodiment of the present invention, the solid solder ball 10 having no flux is melted, thereby allowing the solder 11 to bond to the back electrode 4 and the edge electrode 5. Since the solder ball 10 melts together with the solder paste 8, the solder contained in the solder paste 8 is merged with the molten solder ball 10, and the flux is partially evaporated.

The solder paste 8 for holding the solder ball 10 in position and for expediting the melting of the solder is smaller in volume than the solder ball 10. Even when the solder ball 10 and the solder paste 8 are melted together, the volume of the molten solder is generally maintained. Since the solder 11 (108) formed of the molten solder ball 10 is kept to a constant volume, variations in the projection dimension L of the solder 11 bonded to the edge electrode 5 are controlled. In this way, all edge electrodes 105 are reliably connected to the electrode pads 110 of the mother board 109. The reliability and yield of the modular board are thus greatly improved.

In accordance with the first preferred embodiment, the solder ball 10 containing no flux is used. The volume of the solder paste 8 is preferably smaller than that of the solder ball 10. The solder 11 (108), which is obtained by solidifying the molten solder ball 10 again, is free from flux sticking thereon. Since there is no flux formed thereon, an inspection probe can easily be electrically connected to the solder 108 in an inspection process. This shortens the time required for inspection, and thus the yield of the modular board is greatly improved.

When the blanking plate 7 is arranged on the bare board 1 on the top surface 1A thereof prior to the heating of the bare board 1 to close one opening of the through-hole 2, the molten solder ball 10 is prevented from projecting from the top surface 1A of the bare board 1. With the blanking plate 7, a portion of the molten solder ball 10 that would project out of one opening of the through-hole 2 if the blanking plate 7 were not used, is drawn out of the other opening of the through-hole 2 and swells from the bottom surface 1B of the bare board 1. The projection dimension L of the bump of the solder 108 projecting from the bottom surface 101B of the board 101 is increased.

The back electrode 4 and the edge electrode 5 are removed from the remaining bare board 1C prior to the cutting of the bare board 1. The molten solder ball 10 is prevented from sticking to the remaining bare board 1C. For this reason, the split board 6 is easily separated from the remaining bare board 1C after the molten solder ball 10 is cooled and solidified.

Before the molten solder ball 10 attaches to the edge electrode 5, the split board 6 is separated from the bare board 1 and is placed back into the remaining bare board 1C. This arrangement eliminates the need for cleaning and drying steps in the manufacturing process of the modular board 100, which would be required if the bare board 1 were diced using a diamond cutter. Even if the electronic component 102 is mounted on the split board 6 when the solder 108 is fixed onto the edge electrode 5, the electronic component 102 is free from degradation due to a cleaning operation. The time required to clean the bare board 1 is eliminated. The time required to manufacture the modular board 100 is greatly shortened, and the manufacturing yield is thus greatly improved.

The solder ball 10 is heated and melted with the one opening of the through-hole 2 blocked by the blanking plate 7 in the first preferred embodiment. However, the blocking of the through-hole 2 with the blanking plate 7 is not required. The solder ball 10 may be heated and melted with both openings of the through-hole 2 left opened. Even in this case, the molten solder ball 10 attaches to the back electrode 4, and the solder 11 forms a solder bump projecting from the bottom surface 1B of the bare board 1.

Figure 23:
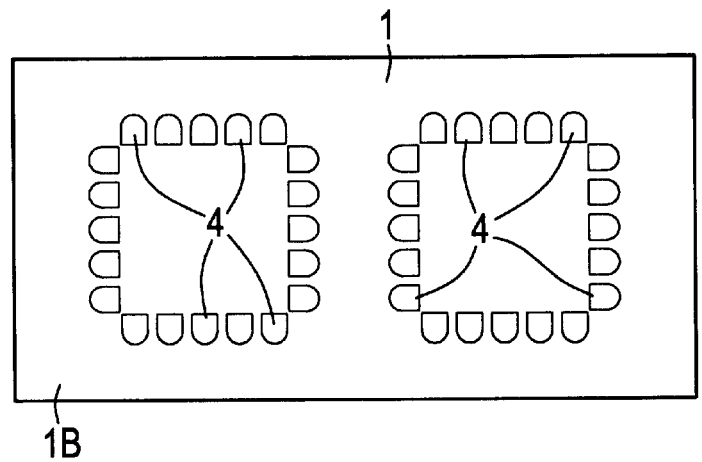
FIG. 23 is a bottom view showing a bare board having a back electrode on the bottom surface thereof, wherein the bare board is produced in a manufacturing method of a modification of the first preferred embodiment of the present invention.
Figure 24:
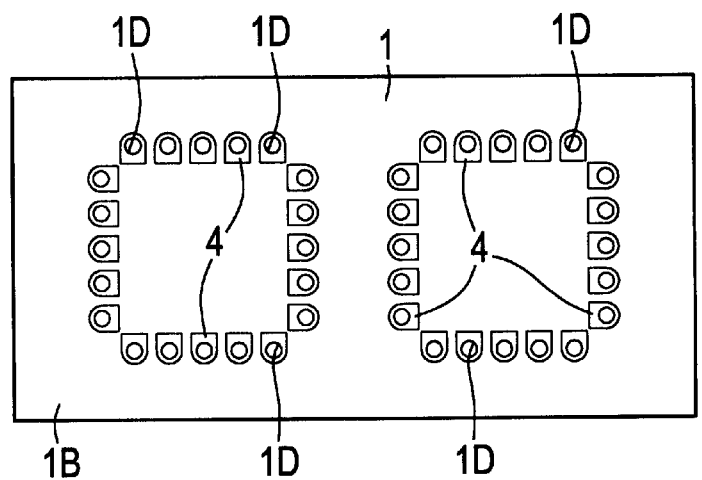
FIG. 24 is a bottom view showing the bare board of FIG. 23 with through-holes opened.

In the first preferred embodiment, the back electrode 4 is formed after the through-hole 1D is opened. In accordance with a modification of the first preferred embodiment as shown in FIG. 23 and FIG. 24, the back electrode 4 may be formed prior to the formation of the through-hole 1D, and the through-hole 1D is then opened in the position of the back electrode 4.

The manufacturing method of a modular board of a second preferred embodiment of the present invention is discussed, referring to FIG. 25 and FIG. 26. The second preferred embodiment includes a solder ball that is held in position using a jig followed by the attachment of a solder paste. In the second preferred embodiment, components identical to those used in the first preferred embodiment are designated with the same reference numerals, and the discussion thereof is omitted. The through-hole formation step, the edge electrode formation step, the push-back step, the through-hole blocking step, and the solder paste deposition step remain unchanged from those in the first preferred embodiment, and the discussion thereof is omitted.

In a solder ball placement step shown in FIG. 25 and FIG. 26, a jig 21 is provided to hold the solder ball 10 in position on the bottom surface 1B of the bare board 1. The jig 21, fabricated of a resin plate, has a positioning hole 21A to accommodate the solder ball 10 at a location corresponding to the through-hole 2. The positioning hole 21A is provided such that the split board 6 with respect to the through-hole 2 is opened and the remaining bare board 1C with respect to the through-hole 2 is closed. The through-hole 2, partially closed by the jig 21, has an opening area that does not permit solder ball 10 to pass therethrough.

Referring to FIG. 26, the solder ball 10 is inserted into the positioning hole 21A. Since the opening area of the through-hole 2 is sized so as not to allow a solder ball 10 to pass therethrough, the solder ball 10 is partially received in the through-hole 2 while blocking the opening of the through-hole 2. Since the positioning hole 21A is offset from the through-hole 2 toward the split board 6, the solder ball 10 is in contact with the edge where the back electrode 4 and the edge electrode 5 meet, while being in contact with the solder paste 8 covering the back electrode 4.

In a heating step, the bare board 1, the blanking plate 7, the jig 21, etc. in this state are heated in a heating furnace. The solder ball 10 is melted, wetting to the back electrode 4 and the edge electrode 5. In the split board separation step, the modular board is separated from the bare board 1.

In the second preferred embodiment, the jig 21 is used to hold the solder ball 10 in position in contact with the solder paste 8. This arrangement prevents the solder ball 10 from moving out of contact with the solder paste 8 because of vibrations, for example, during the heating process. The solder ball 10 is thus reliably melted in the state thereof in contact with the solder paste 8.

Since the solder ball 10 is held by the through-hole 2 with a portion thereof inserted into the through-hole 2, the molten solder ball 10 easily flows into the through-hole 2. Since the solder ball 10 remains in contact with the edge where the back electrode 4 and the edge electrode 5 are connected, the molten solder ball 10 reliably attaches to the back electrode 4 and the edge electrode 5.

Figure 27:
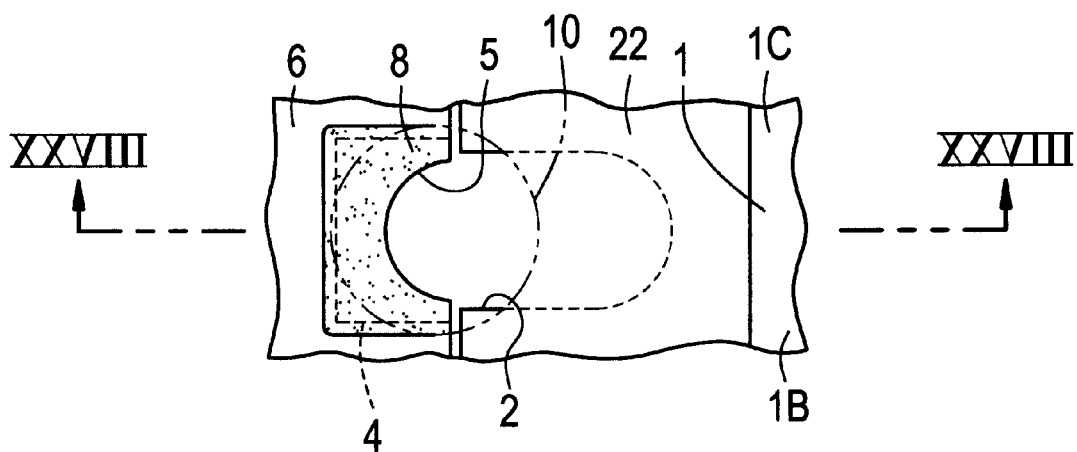
FIG. 27 is an enlarged view of a bare board with a tape applied thereto in a solder ball placement step in the manufacturing method of a modification of the second preferred embodiment of the present invention.
Figure 28:
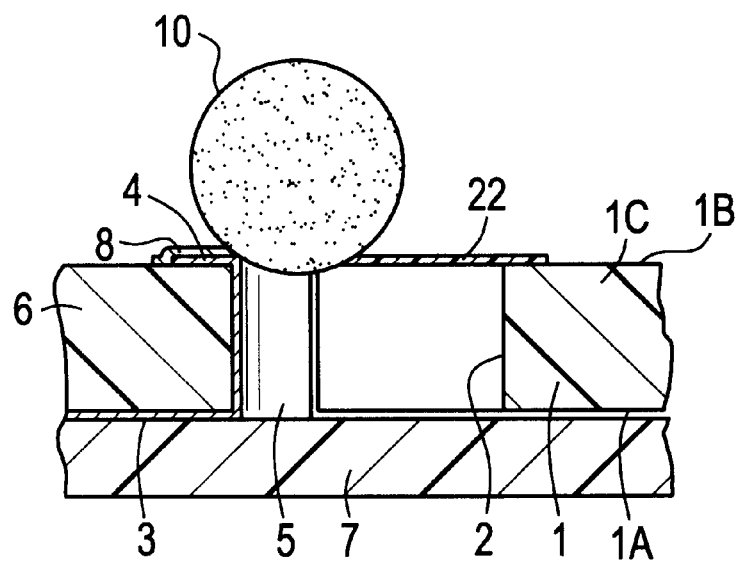
FIG. 28 is a sectional view of the bare board taken along line XXVIII—XXVIII in FIG. 27.

In the second preferred embodiment of the present invention, the positioning hole 21A partially blocks the opening of the through-hole 2 using the jig 21 in the solder ball placement step. The opening of the through-hole 2 may be partially blocked by a heat-resistant tape 22 in a modification of the second preferred embodiment of the present invention, as shown in FIG. 27 and FIG. 28. In this case, the tape 22 is applied on the bottom surface 1B of the remaining bare board 1C in the solder ball placement step, thereby blocking the through-hole 2 on the side of the remaining bare board 1C. With the through-hole 2 blocked, the solder ball 10 is fixed at an opening portion of the through-hole 2.

The split board 6 is separated from the remaining bare board 1C with the tape 22 in the split board separation step subsequent to the bonding of the molten solder ball 10 to the back electrode 4 and the edge electrode 5. The split board separation step is thus greatly simplified and the yield of the modular board is greatly improved.

Figure 29:
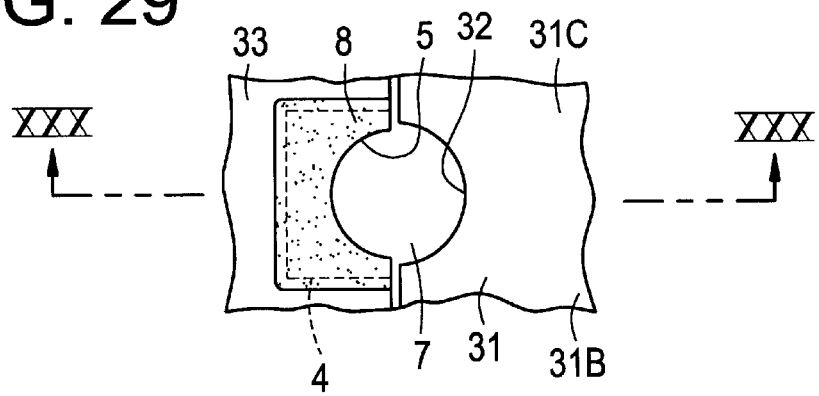
FIG. 29 is an enlarged plan view showing a solder paste deposition step for depositing solder paste on a back electrode in the manufacturing method of a third preferred embodiment of the present invention.
Figure 30:
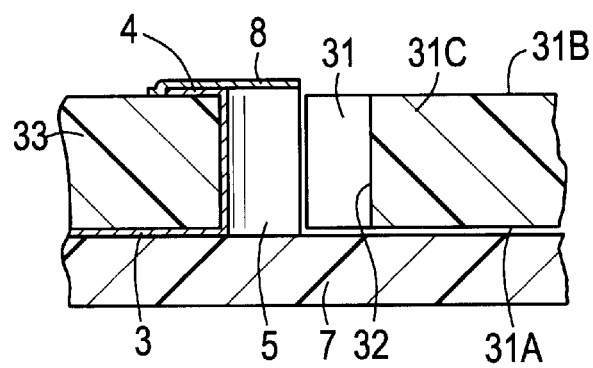
FIG. 30 is a sectional view of the bare board taken along line XXX—XXX in FIG. 29.
Figure 31:
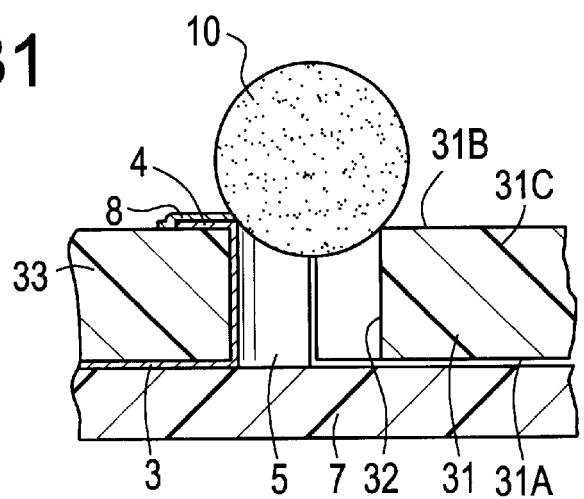
FIG. 31 is a sectional view showing a solder ball placement step for placing a solder ball with a through-hole blocked.

The manufacturing method of a modular board of the third preferred embodiment of the present invention is now discussed, referring to FIG. 29 through FIG. 31. The feature of the third preferred embodiment lies in that a through-hole has a diameter smaller than the diameter of a solder ball, and in that the solder ball is attached on a solder paste with the through-hole closed. Referring to FIG. 29 through FIG. 31, components identical to those used in the first preferred embodiment are designated with the same reference numerals, and the discussion thereof is omitted.

In the preferred third preferred embodiment, as in the first preferred embodiment, a through-hole 32 is opened in a bare board 31 in a through-hole formation step, and in an edge electrode formation step, a wiring 3 is arranged on a top surface 31A of the bare board 31, a back electrode 4 is provided on a bottom surface 31B, and an edge electrode 5 is arranged on the inner wall of the through-hole 32. In a push-back step, the bare board 31 is split between a split board 33 and a remaining bare board 31C, and the split board 33 is placed back into the remaining bare board 31C. The through-hole 32 has a diameter smaller than that of the solder ball 10. In a through-hole blocking step, a blanking plate 7 is placed on the top surface 31A of the bare board 31 to block one opening of the through-hole 32.

Referring to FIG. 29 and FIG. 30, in the same way as in the first preferred embodiment, a solder paste 8 is provided on the bottom surface of the split board 33 to cover a back electrode 4 in a solder paste deposition step.

In a solder ball placement step, the solder ball 10 is placed and held on the through-hole 32 of the bare board 31 with the through-hole 32 closed as shown in FIG. 31. The solder ball 10 is in contact with the edge where the back electrode 4 and the edge electrode 5 are connected to each other While being in contact with the solder paste 8 covering the back electrode 4.

In a heating step, the bare board 31 and the blanking plate 7 are heated in a heating furnace to melt the solder ball 10. The molten solder ball 10 bonds to the back electrode 4 and the edge electrode 5. Finally, the modular board is separated from the bare board 31 in a split board separation step.

In accordance with the third preferred embodiment, the diameter of the through-hole 32 is preferably smaller than the diameter of the solder ball 10. The solder ball 10 is placed on the solder paste 8 with the through-hole 32 blocked. The solder ball 10 is easily and reliably fixed without the need for a jig etc. Compared with the second preferred embodiment, the solder ball placement step is thus simple, and thus greatly improving the yield of the modular board. Unlike the second preferred embodiment, no tape is needed in the third preferred embodiment, thereby manufacturing costs are greatly reduced.

Figure 32:
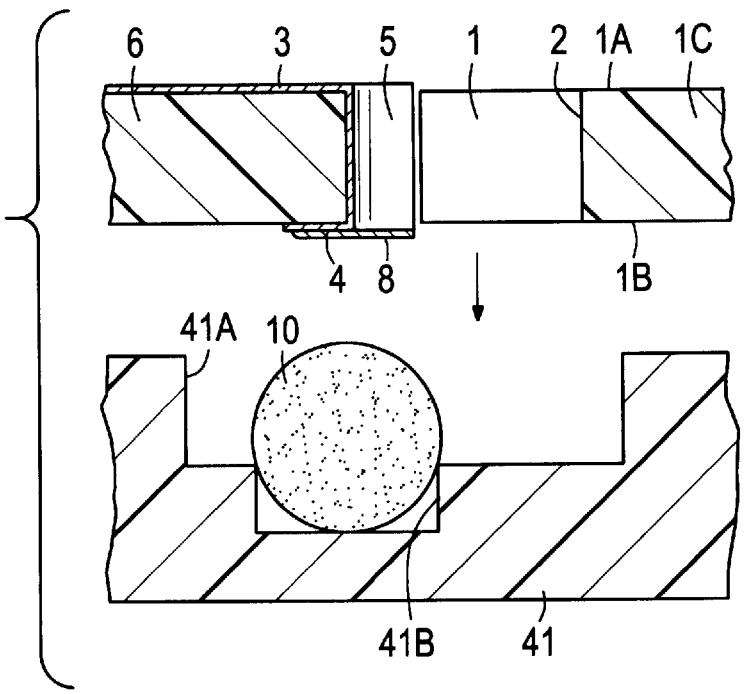
FIG. 32 is a sectional view showing a solder ball placement step for placing a solder ball on a bare board with a jig holding the solder ball in the manufacturing method of a fourth preferred embodiment of the present invention.
Figure 33:
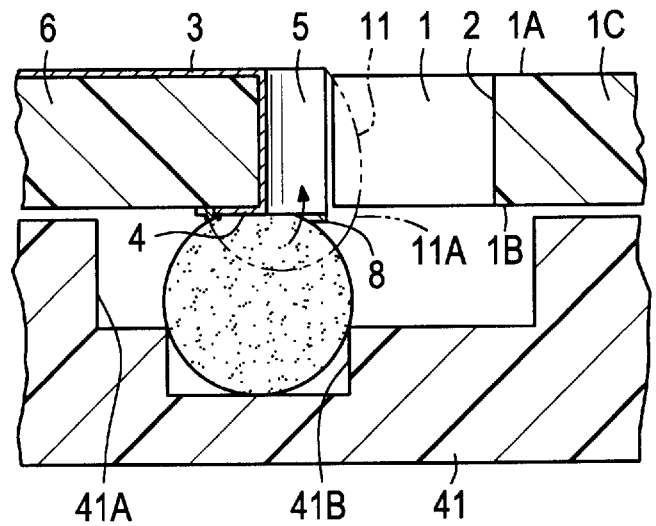
FIG. 33 is a sectional view showing the solder ball that is placed onto the solder paste covering the back electrode in the solder ball placement step.

The manufacturing method of a modular board of a fourth preferred embodiment of the present invention is now discussed, referring to FIG. 32 and FIG. 33. The fourth preferred embodiment includes a bare board which is placed on a jig on which a solder ball is positioned, and that the solder ball is placed on a solder paste covering a back electrode with the back electrode of the bare board facing downward. Referring to FIG. 32 and FIG. 33, components that are identical to those used in the first preferred embodiment are designated with the same reference numerals and the discussion thereof is omitted. The through-hole formation step, the edge electrode formation step, and the push-back step are identical to those in the first preferred embodiment, and the discussion thereof is omitted.

In the fourth preferred embodiment, a solder paste deposition step is performed subsequent to the push-back step. As in the first preferred embodiment, the solder paste 8 is provided on the bottom surface of the split board 6 to cover the back electrode 4.

Referring to FIG. 32 and FIG. 33, the bare board 1 is placed on a jig 41 for holding the solder ball 10 in position with the bottom surface 1B of the bare board 1 facing downward. The jig 41, fabricated of a resin plate, has a substantially rectangular ring recess 41A that runs along the outline of the split board 6 when the bare board 1 is placed on the jig 41. A positioning hole 41B for receiving the solder ball 10 at a location corresponding to the through-hole 2 is provided on the bottom of the recess 41A.

The jig 41 is a vibration jig. To allow the solder ball 10 to sit on the positioning hole 41B of the jig 41, the jig 41 is vibrated with a number of solder balls 10 placed in the recess 41A. The solder balls 10 are thus securely received in the respective positioning holes 41B.

The depth of the positioning hole 41B is set such that the solder ball 10 partially projects out of the recess 41A with the solder ball 10 sitting in the positioning hole 41B. When the bare board 1 is placed on the jig 41, the solder ball 10 is put into contact with the solder paste 8 covering the back electrode 4 with a slight gap between the jig 41 and the bare board 1.

In a heating step, the bare board 1 and the jig 41 in this state are heated. The solder ball 10 is melted and runs along the back electrode 4 and the edge electrode 5 in the direction of an arrow as shown in FIG. 33, forming a swell 11A. The swell 11A bonds to the back electrode 4 and the edge electrode 5 as a solder fillet 11. In succession, the modular board is separated from the bare board 1 in a split board separation step.

In accordance with the fourth preferred embodiment, the solder ball 10 is in contact with the solder paste 8 covering the back electrode 4 with the back electrode 4 of the bare board 1 facing downward. When the solder ball 10 is melted, gravity acting on the solder ball 10 prevents the molten solder ball 10 from swelling upward from the top surface 1A of the bare board 1. The projection dimension of the solder bump 11A of the solder fillet 11 bonded to the back electrode 4 is thus increased.

Figure 34:
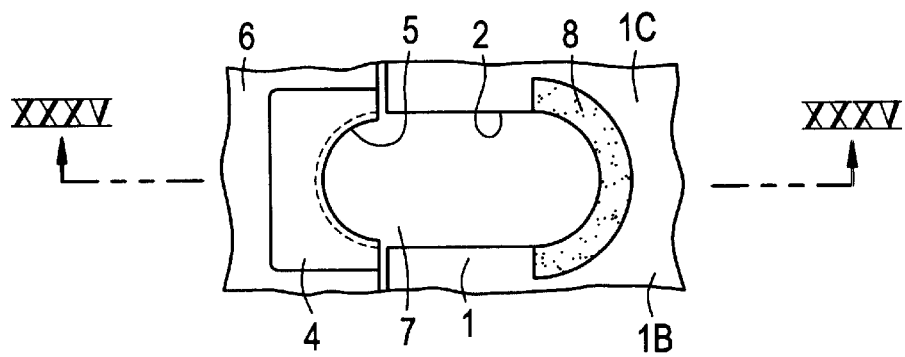
FIG. 34 is an enlarged view showing a remaining bare board on which solder paste is provided in a solder paste deposition step in the manufacturing method of a fifth preferred embodiment of the present invention.
Figure 35:
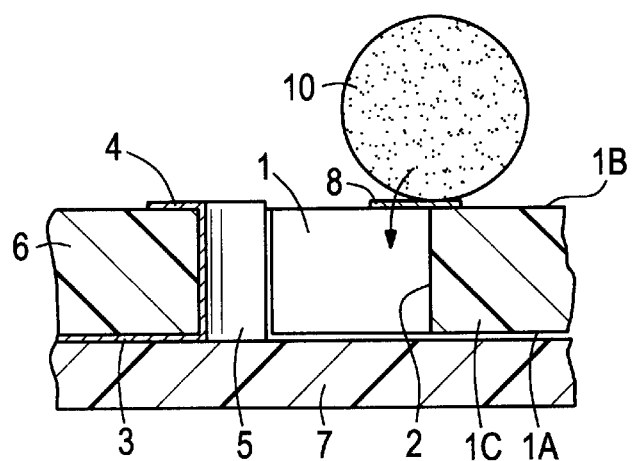
FIG. 35 is a sectional view of the bare board taken along line XXXV—XXXV in FIG. 34, wherein a solder ball is placed onto the paste in a solder ball placement step.
Figure 36:
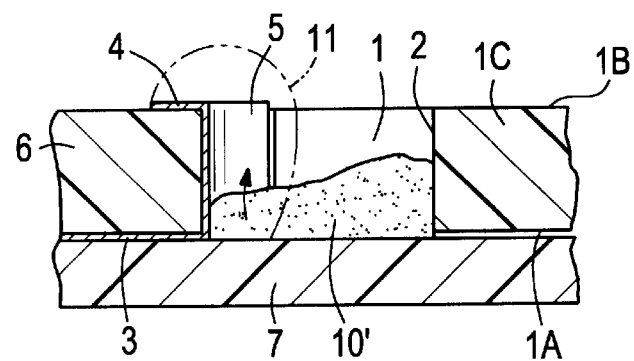
FIG. 36 is a sectional view showing the solder ball in the molten state thereof after heating.

The manufacturing method of a modular board of a fifth preferred embodiment of the present invention is discussed referring to FIG. 34 through FIG. 36. The fifth preferred embodiment includes a solder paste which is provided on the bottom surface of a remaining bare board followed by the placement of a solder ball onto the solder paste. Referring to FIG. 34 and FIG. 35, components identical to those described in the first preferred embodiment are designated with the same reference numeral, and the discussion thereof is omitted. In the fifth preferred embodiment, the through-hole formation step, the edge electrode formation step, the push-back step, and the through-hole formation step are identical to those in the first preferred embodiment, and the discussion thereof is omitted.

In a solder paste deposition step shown in FIG. 35, a solder paste 8 is provided in a half-ring shape on the bottom surface of a remaining bare board 1C in the vicinity of a through-hole. In a solder ball placement step shown in FIG. 36, a solder ball 10 is placed and fixed onto the solder paste 8 provided on the remaining bare board 1C.

The bare board 1 and the blanking plate 7 in the state as described above are heated in a heating furnace. The solder ball 10 is melted, and spreads in and around the through-hole 2 and then runs into the through-hole 2 as represented by an arrow shown in FIG. 35. A molten solder ball 10' spreads within the through-hole 2, and comes into contact with an edge electrode 5, as shown in FIG. 36. The molten solder ball 10' rises along the edge electrode 5 as shown in FIG. 36, and reaches the back electrode 4, and solidifies and bonds to the back electrode 4 and the edge electrode 5 as a solder fillet 11. A modular board is then separated from the bare board 1 in a split board separation step.

In accordance with the fifth preferred embodiment, the solder paste 8 is provided on the remaining bare board 1C and the solder ball 10 is placed on the solder paste 8. The split board 6 does not require deposition area for the solder paste 8 in the fifth preferred embodiment in contrast to the preceding preferred embodiments in which the solder paste 8 is provided on the split board 6. The fifth preferred embodiment therefore allows the electronic component to be mounted near the edge electrode 5 which greatly increases the degree of integration of the modular board.

Figure 37:
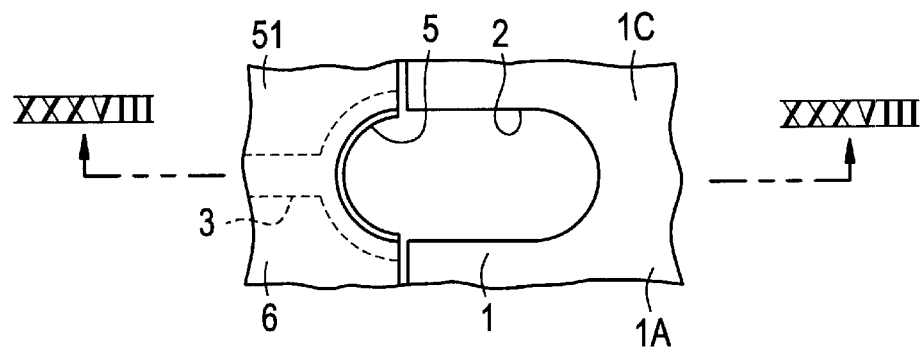
FIG. 37 is an enlarged plan view showing a split board which is placed back into a remaining bare board in a pushback step in the manufacturing method of a sixth preferred embodiment of the present invention.
Figure 38:
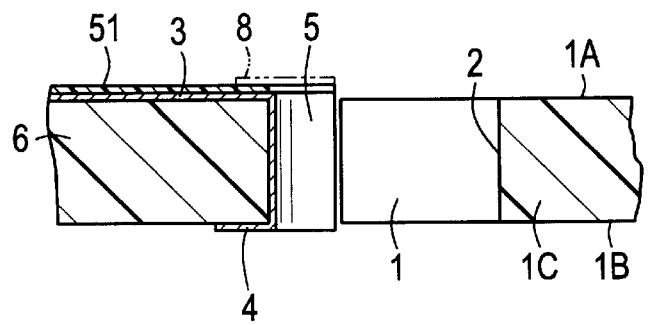
FIG. 38 is a sectional view of the split board taken along line XXXVIII—XXXVIII in FIG. 37.
Figure 39:
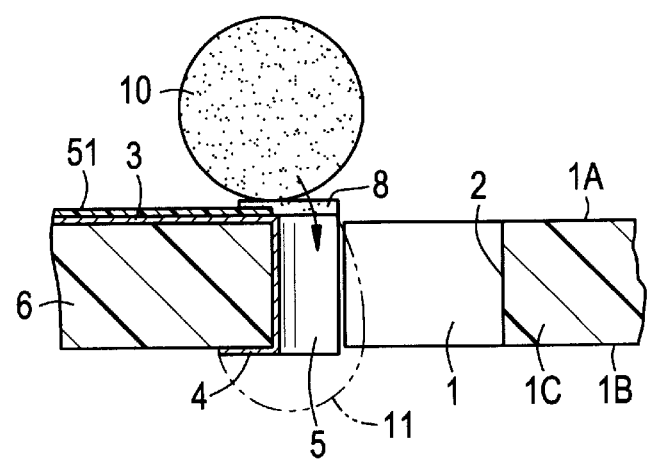
FIG. 39 is a sectional view showing the split board in which a solder ball is placed onto a solder paste in a solder ball placement step.

The manufacturing method of a modular board of a sixth preferred embodiment of the present invention is now discussed referring to FIG. 37 through FIG. 39. The sixth preferred embodiment includes a solder paste that is provided on the top surface of a split board followed by the placement of a solder ball onto the solder paste. Referring to FIG. 37 through FIG. 39, components identical to those described in the first preferred embodiment are designated with the same reference numeral, and the discussion thereof is omitted. In the sixth preferred embodiment, the through-hole formation step, the edge electrode formation step, and the push-back step are identical to those in the first preferred embodiment, and the discussion thereof is omitted.

In the sixth preferred embodiment, the push-back step shown in FIG. 37 and FIG. 38 is followed by a solder paste deposition step, in which the solder paste 8 is provided on the top surface of the split board 6 around a through-hole 2. A wiring 3 is covered with a resist film 51 to prevent a molten solder ball 10 from wetting thereto. The solder paste 8 is provided in a half-ring configuration around the through-hole 2, and is partially in contact with the edge of the edge electrode 5 that extends in the direction of thickness of the split board 6.

In a solder ball placement step shown in FIG. 39, the solder ball 10 is placed and fixed on the solder paste 8 provided on the top surface of the split board 6. The solder ball 10 is on the top side of the bare board 1.

The bare board 1 in the state described above is heated in a heating step. The solder ball 10 is melted and spreads along the solder paste 8, while coming into contact with the edge of the edge electrode 5 on the top surface of the split board 6. The molten solder ball 10 runs down along the edge electrode 5 as represented by an arrow as shown in FIG. 39, thereby reaching the back electrode 4. The molten solder ball 10 solidifies and bonds to the back electrode 4 and the edge electrode 5 as a solder fillet 11. The modular board is then separated from the bare board 1 in a split board separation step.

The manufacturing method of the modular board of the sixth preferred embodiment has been discussed, and has the same advantages and operation as those of the first preferred embodiment.

Figure 40:
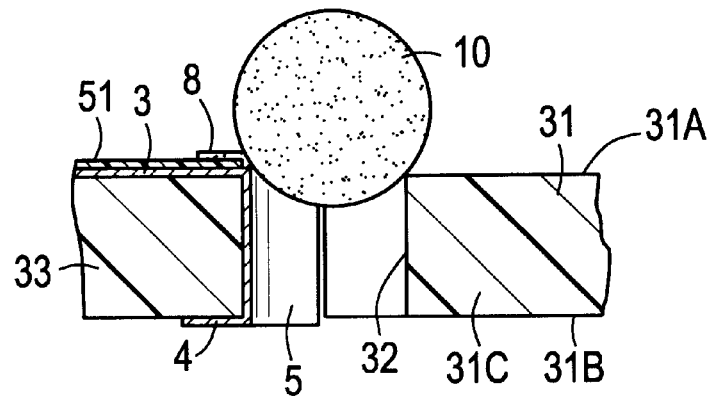
FIG. 40 is a sectional view showing a solder ball placement step for placing a solder ball with a through-hole blocked in the manufacturing method of a first modification of the sixth preferred embodiment of the present invention.

In accordance with the sixth preferred embodiment, the solder paste 8 is provided on the top surface of the split board 6, and the solder ball 10 is placed on the solder paste 8. However, the diameter of the through-hole 32 may be set to be smaller than the diameter of the solder ball 10 as in the third preferred embodiment. In such a case, referring to FIG. 40 showing a modification of the sixth preferred embodiment, the wiring 3 is covered with the resist film 51, the solder paste 8 is provided on the top surface of the split board 33, the solder ball 10 is placed such that the solder ball 10 in contact with the solder paste 8 blocks the opening of the through-hole 32.

Figure 41:
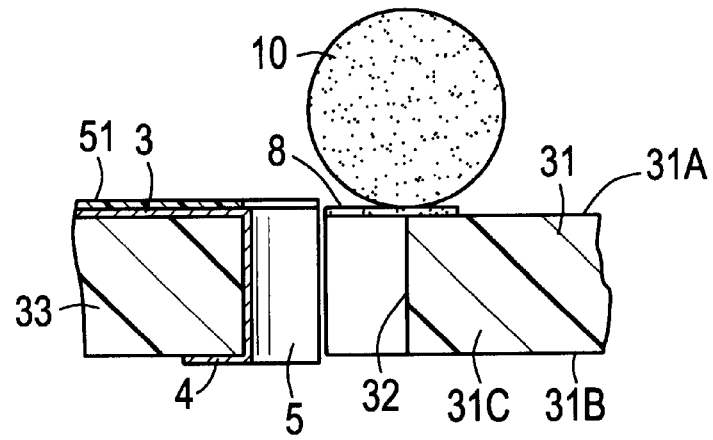
FIG. 41 is a sectional view showing a solder ball placement step for placing a solder ball on solder paste on a remaining bare board in the manufacturing method of a second modification of the sixth preferred embodiment of the present invention.

Referring to FIG. 41 showing a second modification of the sixth preferred embodiment, the solder paste 8 is provided on the top surface of the remaining bare board 31C, and the solder ball 10 is placed onto the solder paste 8.

Figure 42:
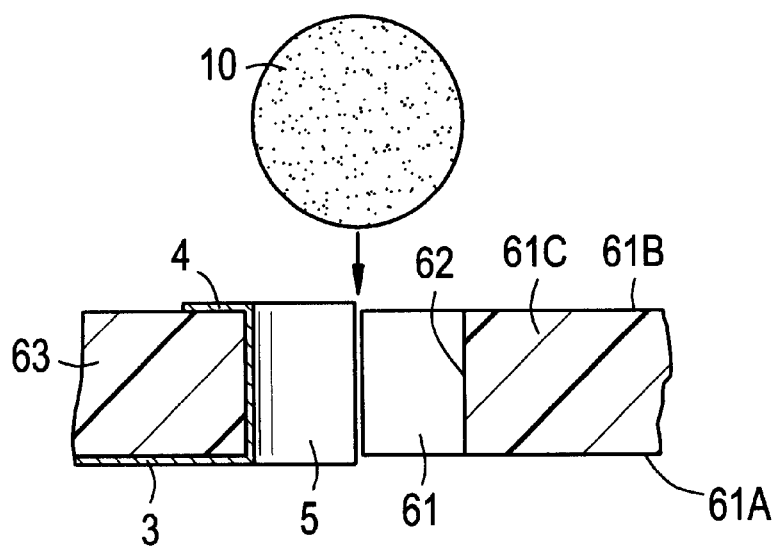
FIG. 42 is a sectional view showing a solder ball placement step for holding a solder ball within a through-hole in the manufacturing method of a seventh preferred embodiment of the present invention.
Figure 43:
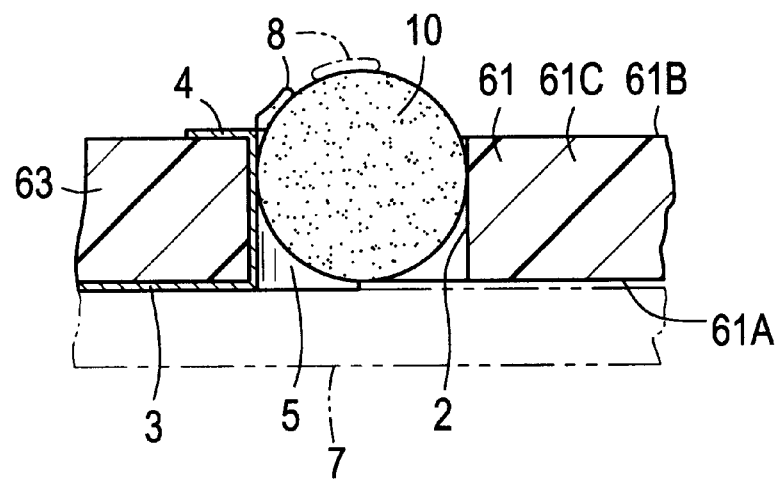
FIG. 43 is a sectional view showing a solder paste deposition step for depositing solder paste onto a solder ball.
Figure 44:
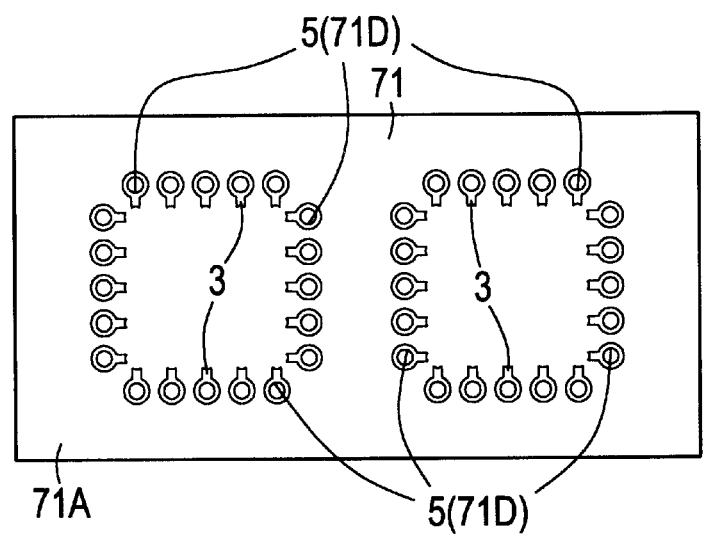
FIG. 44 is a plan view showing an edge electrode formation step for forming an edge electrode on a bare board in the manufacturing method of an eighth preferred embodiment of the present invention.
Figure 45:
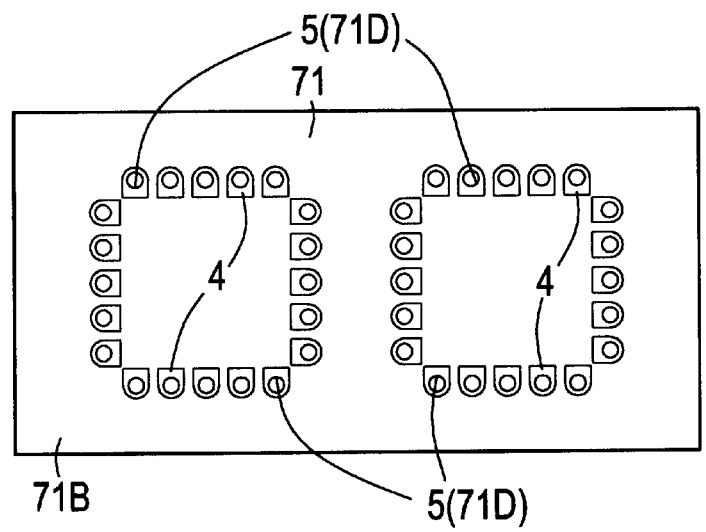
FIG. 45 is a bottom view showing the bare board of FIG. 44.

The manufacturing method of a modular board of a seventh preferred embodiment of the present invention is discussed referring to FIG. 42 and FIG. 43. The seventh preferred embodiment includes a substantially circular through-hole that is preferably larger in diameter than a solder ball to accommodate the solder therewithin. In FIG. 42 and FIG. 43, components described in connection with the preferred embodiment are designated with the same reference numerals, and the discussion thereof is omitted.

In the seventh preferred embodiment, a through-hole 62 is opened in a bare board 61 in a through-hole formation step in the same way as in the first preferred embodiment. In an edge electrode formation step, a wiring 3 is provided on the top surface 61A of the bare board 61, a back electrode 4 is provided on the bottom surface 61B of the bare board 61, and an edge electrode 5 is provided on the inner wall of the through-hole 62. In a push-back step, the bare board 61 is separated into a split board 63 and a remaining bare board 61C, and the split board 63 is placed back into the remaining bare board 61C. The through-hole 62 is a substantially circular hole having a diameter larger than that of the solder ball 10.

In a solder ball insertion step shown in FIG. 42, the diameter of the solder ball 10 is preferably approximately equal to the diameter of the through-hole 62 to accommodate the solder ball 10 within the through-hole 62. The solder ball 10 in contact with the edge electrode 5 is supported on the inner wall of the through-hole 62.

In a solder paste deposition step shown in FIG. 43, the solder paste 8 is provided to the solder ball 10 received in the through-hole 62. The solder paste 8 sticking to the solder ball 10 is partially in contact with the back electrode 4 and the edge electrode 5. It is not necessary to apply the solder paste 8 in contact with the back electrode 4 etc. The solder paste 8 may be provided on the peak of the solder ball 10 as represented by a two-dot-and-dash chain line in FIG. 43.

In a heating step, the bare board 61 in the state as described above is heated in a heating furnace. The solder ball 10 is melted and spreads along the edge electrode 5, and solidifies and bonds to the back electrode 4 and the edge electrode 5. The modular board is then separated from the bare board 31 in a split board separation step.

The manufacturing step of the modular board of the seventh preferred embodiment has been discussed. The seventh preferred embodiment also provides the same advantages and operation of the first preferred embodiment. The seventh preferred embodiment holds the solder ball 10 in position more easily than in the first preferred embodiment.

In accordance with the seventh preferred embodiment, the solder paste 8 is provided on the solder ball 10 after the solder ball 10 is inserted into the through-hole 62. Alternatively, the solder paste 8 is provided onto the solder ball 10, which is then inserted into the through-hole 62.

When the solder ball 10 is smaller in diameter than the through-hole 62, the solder ball 10 is accommodated in the through-hole 62 with the through-hole 62 blocked with a blanking plate 7, a flux or other suitable mechanism is provided in the through-hole 62, and the solder ball 10 is fixed to the edge electrode 5 with a sticking force of the flux.

In accordance with the seventh preferred embodiment, the diameter of the solder ball 10 is approximately equal to the diameter of the through-hole 62 to accommodate the solder ball 10 within the through-hole 62. However, the present invention is not limited to this. For example, when the solder ball 10 is larger in diameter than the through-hole 62, the solder ball 10 may be placed in a manner to block the opening of the through-hole 62 (see FIG. 31), and the solder paste 8 is then provided on the solder ball 10 in the same manner as in the third preferred embodiment.

The manufacturing method of a modular board of an eighth preferred embodiment of the present invention is now discussed referring to FIG. 44 through FIG. 50. The eighth preferred embodiment includes a solder ball which is placed on a solder paste after the solder paste is provided on a pre-split board defined a series of slits. In FIG. 44 through FIG. 50, components identical to those described with reference to the first preferred embodiment are designated with the same reference numerals, and the discussion thereof is omitted.

In the eighth preferred embodiment, as in the first preferred embodiment, a through-hole 71D is opened in a bare board 71 in a through-hole formation step. In an edge electrode formation step shown in FIG. 44 and FIG. 45, a wiring 3 is provided on the top surface 71A of the bare board 71, a back electrode 4 is provided on a bottom surface 71B of the bare board 71, and an edge electrode 5, connected to the back electrode 4 and the wiring 3, is provided on the inner wall of the through-hole 71D.

Figure 46:
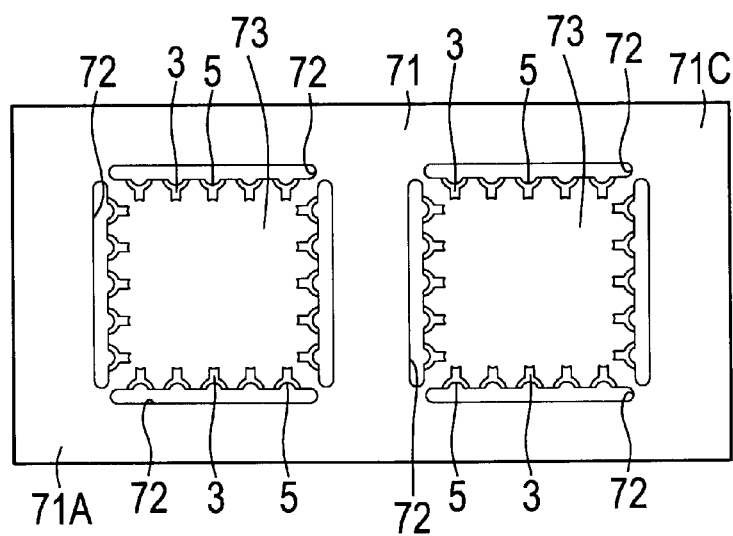
FIG. 46 is a plan view showing a slit formation step for forming a slit in the bare board.
Figure 47:
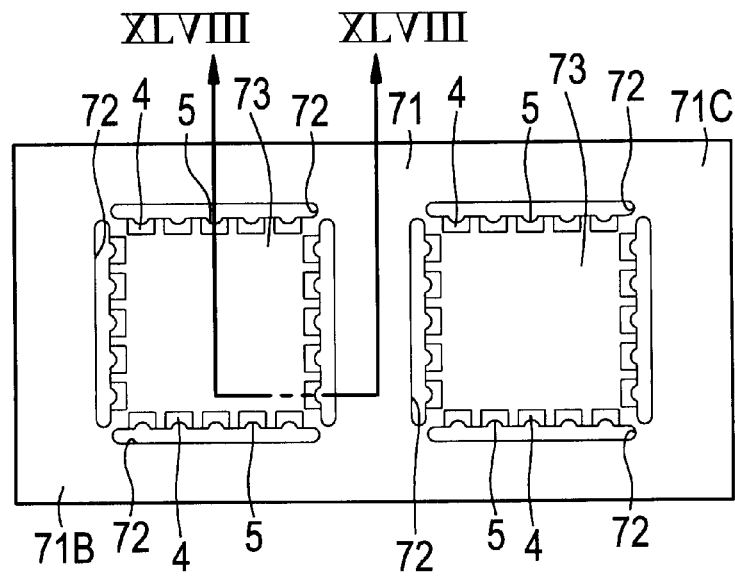
FIG. 47 is a bottom view showing the bare board of FIG. 46.
Figure 48:
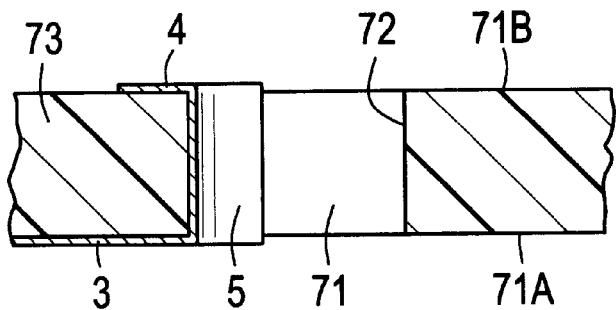
FIG. 48 is a sectional view of the bare board taken along line XLVII—XLVII in FIG. 47 with the top side thereof down.

In a slit opening step shown in FIG. 46 through FIG. 48, a slit 72 is opened, thereby partially removing the wall of the through-hole 71D while leaving the edge electrode 5. A plurality of slits 72 is arranged along the outline of a pre-split board 73 as opposed to the board 101.

The bare board 1 includes the pre-split board 73 surrounded by the slits 72, and a remaining bare board 71C which surrounds the pre-split board 73 and is connected to the pre-split board 73 at the four corners thereof. The pre-split board 73 includes the wiring 3, the back electrode 4, and the edge electrode 5 while the opening of the slits 72 removes the edge electrodes 5 from the remaining bare board 71C.

Figure 49:
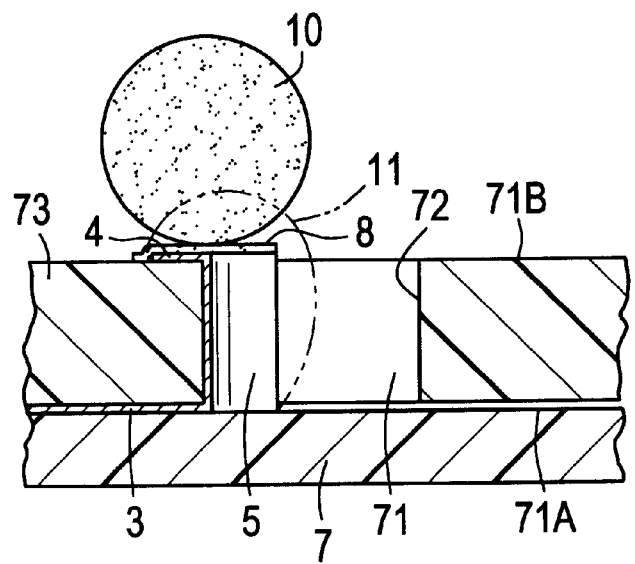
FIG. 49 is a sectional view of the bare board, wherein a solder ball is placed onto solder paste covering a back electrode through a solder paste deposition step and a solder ball placement step.

In a slit blocking step shown in FIG. 49, a blanking plate 7 is attached on the top surface 71A of the bare board 71 to block the slits 72 from the top side. In a solder paste deposition step, a solder paste 8 is provided on the back electrode 4 on the bottom surface of the pre-split board 73. After the solder ball 10 is placed on the solder paste 8 to be fixed, the bare board 71 is heated in a heating step. The solder ball 10 is melted, and then solidifies and bonds to the back electrode 4 and the edge electrode 5.

Figure 50:
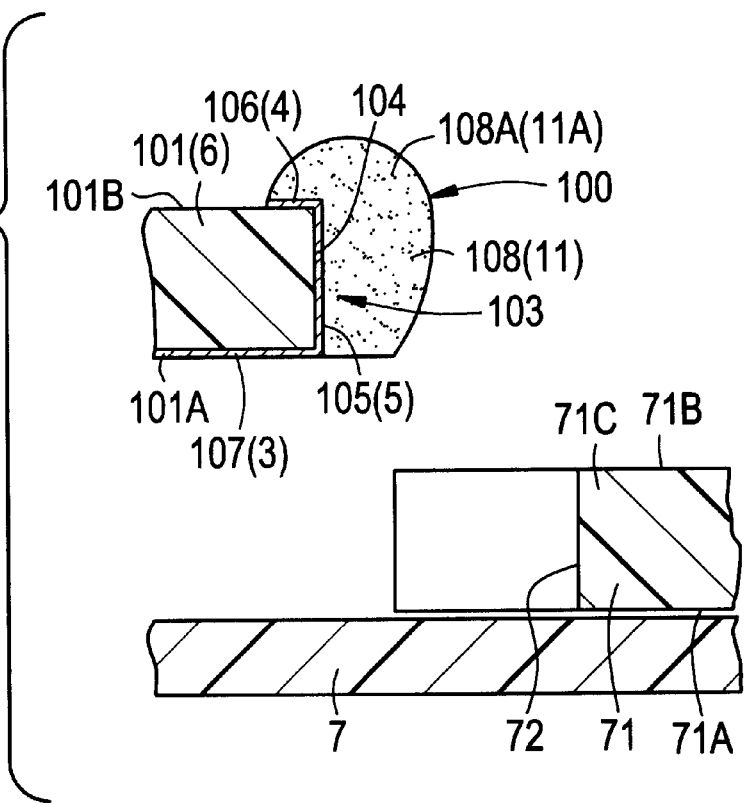
FIG. 50 is a sectional view showing a board separation step for separating a pre-split board from a bare board.

In a board separation step shown in FIG. 50, a jig plate 74 is removed from the bare board 71, and the bare board 71 is then cut at a line which defines the border between the pre-split board 73 and the remaining bare board 71C. The pre-split board 73 is thus separated from the bare board 71. A modular board 100 having a solder fillet 108 bonded to an edge electrode 105 thus results.

The manufacturing method of the modular board of the eighth preferred embodiment has been discussed. The eighth preferred embodiment has the same advantages and operation as those of the first preferred embodiment.

In accordance with the eighth preferred embodiment, the four slits 72 surround the pre-split board 73. Alternatively, a single slit disposed in a substantially rectangular frame outline may be used, thereby surrounding the pre-split board 73.

Figure 51:
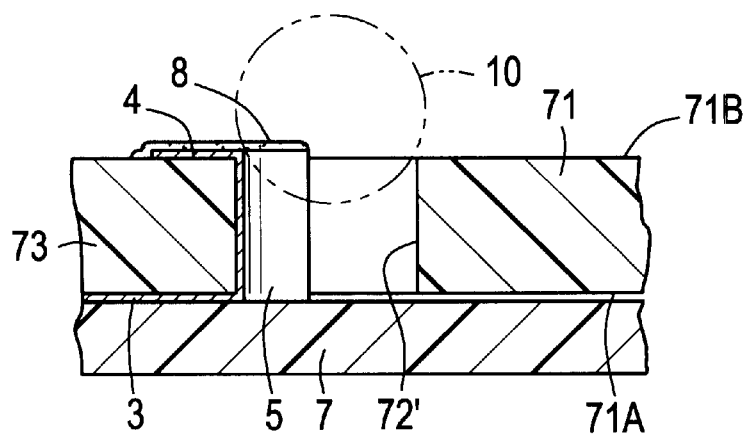
FIG. 51 is a sectional view showing a solder ball placement step for placing a solder ball with a through-hole blocked in the manufacturing method of a first modification of the eighth preferred embodiment of the present invention.

In accordance with the eighth preferred embodiment, the solder ball 10 is placed onto the solder paste 8. Alternatively, referring to FIG. 51 showing a first modification of the eighth preferred embodiment, the width of a slit 72' is narrowed to partially block the slit 72' at a location corresponding to the edge electrode 5. At this location, the solder ball 10 is placed and fixed onto the solder paste 8 on the back electrode 4. Alternatively, the solder paste 8 may be provided on the solder ball 10 after the solder ball 10 is placed to partially block the slit 72'.

Figure 52:
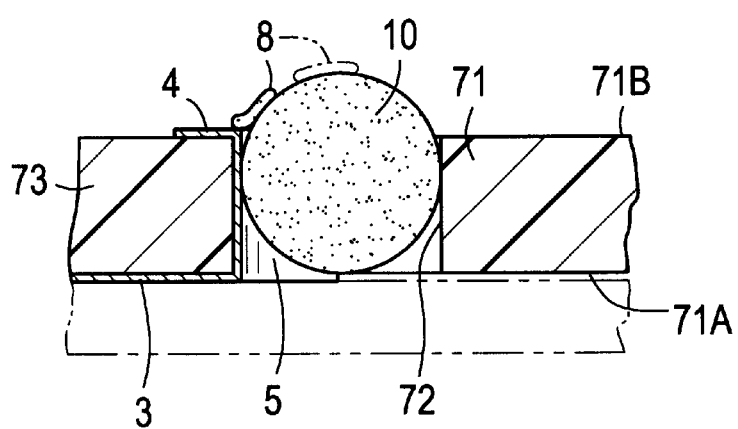
FIG. 52 is a sectional view showing a solder ball placement step for placing a solder ball in a slit at a position facing an edge electrode in the manufacturing method of a second modification of the eighth preferred embodiment of/the present invention.

FIG. 52 shows a second modification of the eighth preferred embodiment, the width of the slit 72 is wide enough to receive between the edge electrode 5 and the side inner wall of the slit 72. The solder ball 10 is thus received within the slit 72 facing the edge electrode 5, and the solder paste 8 is provided on the solder ball 10. The solder paste 8 may be provided in contact with the back electrode 4 and the edge electrode 5 as represented by a solid line in FIG. 52 or may be provided out of contact with the back electrode 4 as represented by a two-dot-and-dash chain line in FIG. 52. Alternatively, the solder paste 8 may be provided to the solder ball 10 before the solder ball 10 is accommodated within the slit 72.

In the eighth embodiment, a jig may be used to position and fix the solder ball 10 as in the second preferred embodiment. In the same way as in the fourth and sixth the solder paste 8 may be provided on the top surface or the bottom surface of the pre-split board 73, and the solder ball 10 may be fixed onto the solder paste 8.

Figure 53:
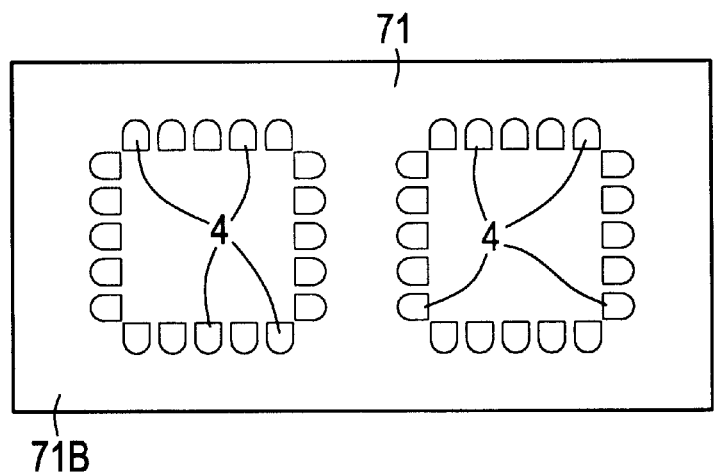
FIG. 53 is a bottom view showing a bare board with a back electrode mounted on the bottom surface thereof in the manufacturing method of a third modification of the eighth preferred embodiment of the present invention.
Figure 54:
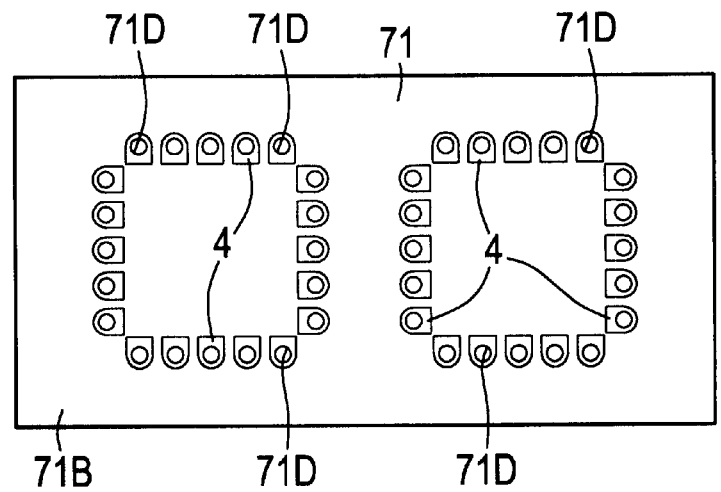
FIG. 54 is a bottom view showing the bare board of FIG. 53 with through-holes opened therewithin.

FIG. 53 and FIG. 54 show a third modification of the eighth preferred embodiment, the wiring 3 and the back electrode 4 are arranged in the bare board 1 before opening a substantially circular through-hole 71D in the bare board 1, the substantially circular through-hole 71D is opened in the position of the back electrode 4, and thereafter the edge electrode 5 is provided.

The manufacturing method of a modular board of a ninth preferred embodiment of the present invention is discussed referring to FIG. 55 through FIG. 58. The ninth preferred embodiment includes a bare board that is cut along a through-hole using a diamond cutter after solder is fixed to an edge electrode. In FIG. 55 through FIG. 58, components identical to those with reference to the first preferred embodiment are designated with the same reference numerals, and the discussion thereof is omitted.

Figure 55:
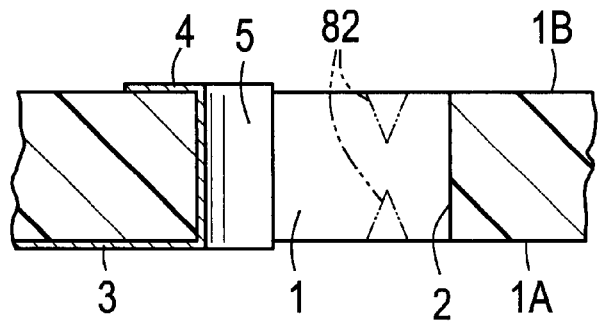
FIG. 55 is a sectional view showing an edge electrode formation step for forming a through-hole and an edge electrode in a bare-board in the manufacturing method of a ninth preferred embodiment of the present invention.

In the ninth preferred embodiment, as in the first preferred embodiment, a preliminary circular through-hole (not shown) is opened in a bare board 1 in a through-hole formation step, and in an edge electrode formation step as shown in FIG. 55, a wiring 3 is provided on the top surface 1A of the bare board 1, a back electrode 4 is provided on the bottom surface 1B of the bare board 1, and an edge electrode 5 is formed on the inner wall of a through-hole. A through-hole 2 having a substantially oval shape is formed by partially cutting away the edge electrode 5. A portion of the bare board 1 surrounded by the through-holes 2 and becoming a modular board includes the wiring 3, the back electrode 4, and the edge electrode 5, while the remaining bare board has no edge electrode 5.

The wiring 3 and the back electrode 4 may be arranged on the bare board 1 before opening the substantially circular through-hole in the bare board 1, and the substantially circular through-hole may be then opened in the position of the back electrode 4, and thereafter the edge electrode 5 may be formed.

Figure 56:
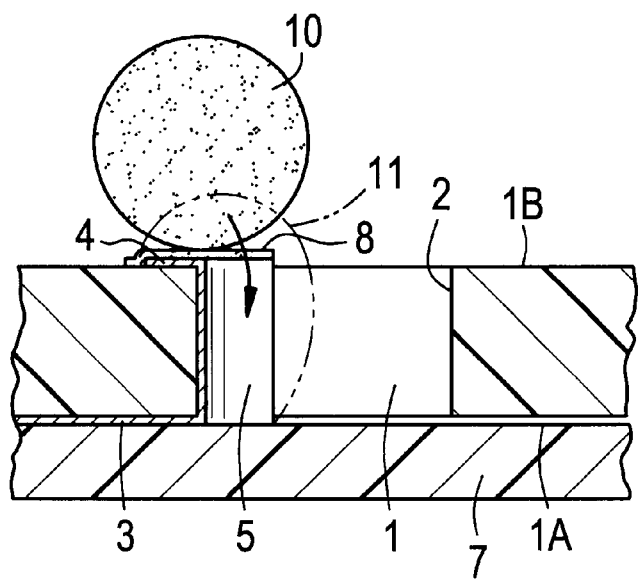
FIG. 56 is a sectional view showing a solder ball that is placed onto a back electrode through a through-hole blocking step, a solder paste deposition step, and a solder ball placement step.

In a through-hole blocking step shown in FIG. 56, a blanking plate 7 is arranged on the top surface 1A of the bare board 1, and a solder paste 8 is provided on the back electrode 4 in a solder paste deposition step with one opening of the through-hole 2 blocked with the blanking plate 7. In a solder ball placement step, the solder ball 10 is fixed on the solder paste 8. In a heating step, the bare board 1 is heated to melt the solder ball 10. The molten solder ball 10 solidifies and bonds to the back electrode 4 the edge electrode 5 as a solder fillet 11.

Figure 57:
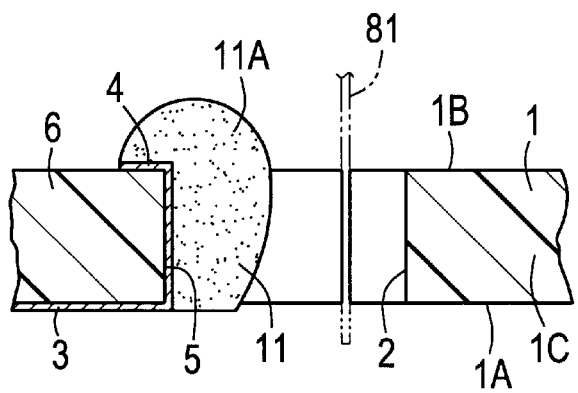
FIG. 57 is a sectional view showing a board cutting step for cutting the bare board using a diamond cutter.
Figure 58:
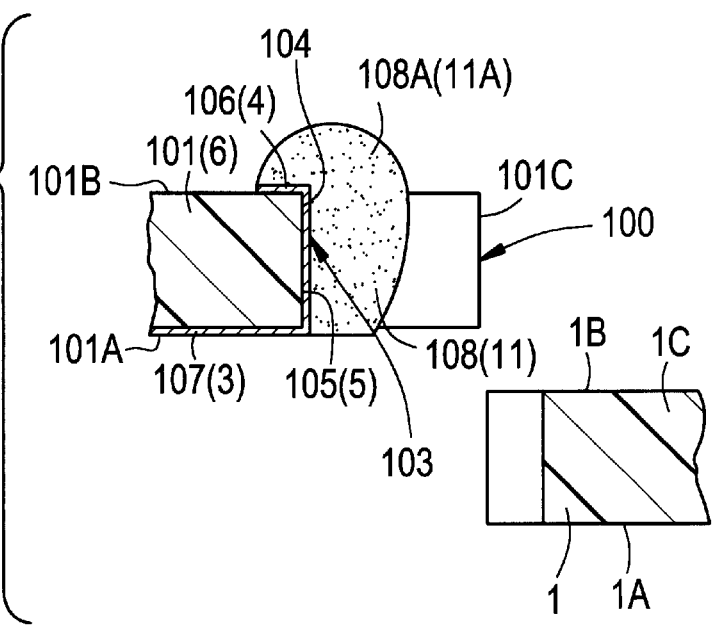
FIG. 58 is a sectional view showing a modular board separated from the bare board subsequent to the cutting of the modular board.

In a board cutting step shown in FIG. 57, the bare board 1 is cut using a diamond cutter 81 to separate a split board 6 from the bare board 1. Referring to FIG. 58, the split board 6 is separated from the bare board 1. Since the diamond cutter 81 dices the bare board 1 along the through-hole 2, a portion of the through-hole 2 becomes an end surface notch 104 of a board 101. The edge electrode 5 becomes an edge electrode 105 covering the end surface notch 104. Since the solder fillet 11 bonds to the edge electrode 5, the board 101 is separated from the bare board 1 with a solder fillet 108 remaining bonded to the edge electrode 105. A modular board 100 is thus produced.

The manufacturing method of the modular board of the ninth preferred embodiment has been discussed. The ninth preferred embodiment also has the same advantages and operation as those of the first preferred embodiment.

In accordance with the ninth preferred embodiment, the bare board 1 is cut using the diamond cutter 81. Alternatively, a substantially V-groove 82 is provided beforehand in the bare board 1 as shown in FIG. 55. In this case, the through-hole 2 overextends the substantially V-groove 82. When the solder fillet 11 is formed on the edge electrode 5, the bare board 1 is separated along the substantially V-groove 82.

In accordance with the ninth preferred embodiment, the solder ball 10 is melted with the edge electrode 5 arranged on a portion of the through-hole 2, and is solidified and bonded to the edge electrode 5. Referring to FIG. 59 showing a modification of the ninth preferred embodiment, the solid solder may be melted on an edge electrode 5 that covers entirely on the inner wall of a through-hole 1D, and may be solidified and bonded to the edge electrode 5. In this case, after a solder fillet 11' is bonded to the edge electrode 5, the bare board 1 is cut along a plane running in the center of the through-hole 1D using the diamond cutter 81.

In accordance with the ninth preferred embodiment, the solder ball 10 is placed onto the solder paste 8 in the same manner as in the first preferred embodiment. Alternatively, the solder ball 10 may be placed onto the solder paste 8 in the same manner as in the second through seventh preferred embodiments.

In each of the preceding preferred embodiments, the edge electrode 105 (5) has a hollow substantially semicylinder configuration. Alternatively, the edge electrode 105 may be substantially triangular or square in cross section, or may have a planar configuration directly arranged on the end surface 101C. The back electrode 106 (4) is not limited to a substantially rectangular shape. The back electrode 106 (4) may be substantially polygonal or arc in shape.

In each of the preceding preferred embodiments, the solid solder is a substantially spherical solder ball 10. Alternatively, the solid solder may have any suitable shape.

In accordance with preferred embodiments of the present invention, the adhesive compound containing the oxide removal substance is attached on the area surrounding the through-hole, the solid solder is placed on the adhesive agent, the split board is heated to melt the solid solder, and the molten solder is solidified and bonded to the edge electrode and the back electrode. The solid solder is thus held in position and fixed by the adhesive compound. When the split board and the remaining bare board are heated, the adhesive compound functions as a catalyzer, the solid solder is melted at the portion thereof in contact with the adhesive compound, and flows into the through-hole, and attaches to the back electrode and the edge electrode. Since the solid solder is melted and then cooled for solidification and bonding, the projection dimension of the solid solder bump projecting out of the through-hole is uniform. All edge electrodes are thus reliably connected to the respective electrode pads of the mother board.

Since the back electrode and the edge electrode are removed from the remaining bare board prior to the cutting of the bare board, the molten solder is prevented from sticking to the remaining bare board. After the molten solder is cooled and solidified, the split board is easily separated from the remaining bare electrode.

The adhesive compound is arranged in contact with the edge electrode on the top surface of the split electrode. When the split electrode with the solid solder attached onto the adhesive compound is heated, the solid solder starts melting at the portion thereof in contact with the adhesive compound. In this way, the molten solder attaches to the edge electrode while part of the molten solder runs along the edge electrode to cover the back electrode. The solder reliably bonds to the edge electrode and the back electrode.

Since the adhesive compound is provided in contact with the back electrode on the bottom surface of the split board, the molten solder spreads along the back electrode. The molten solder reliably bonds to the edge electrode and the back electrode.

The adhesive compound is placed in the vicinity of the opening of the through-hole on the top surface or the bottom surface of the remaining bare board. The molten solder runs into the through-hole, thereby solidifying and bonding to the edge electrode in the through-hole. Compared to the case in which the adhesive compound is provided on the split board, a small split board works, the degree of integration of electronic components is greatly improved.

Since the adhesive compound is provided with the through-hole blocked, the solder in its molten state enters into the through-hole, and the molten solder reliably attaches to the edge electrode in the through-hole.

The adhesive compound is provided to the solid solder to or subsequent to the placement of the solid solder. When the split board is heated, the solid solder is melted while being in contact with the edge electrode. A portion of the molten solder runs along the edge electrode and covers the back electrode. As a result, the solder solidifies and bonds to the edge electrode and the back electrode.

Since the back electrode and the edge electrode are removed from the remaining bare board before the bare board is cut, the molten solder is prevented from sticking to the remaining bare board. Thus, the split board is easily removed from the remaining bare board after the molten solder solidifies.

The solid solder blocks the through-hole or is accommodated within the through-hole. The solid solder is thus held in position by the through-hole. When the solid solder is melted, the molten solder easily attaches to the edge electrode attached on the inner wall of the through-hole.

The pre-split board having the edge electrode and the back electrode surrounded by slits is formed in the bare The adhesive compound having the oxide removal is provided in the vicinity of the edge electrode. After the solid solder is placed onto the adhesive compound, the pre-split board is heated to melt the solid solder. The molten solder thus attaches to, solidifies, and bonds to the edge electrode and the back electrode. The solid solder is thus held in position by the adhesive compound. The solid solder is melted at the portion thereof in contact with the adhesive compound, and the molten solder enters into the through-hole. In this way, the molten solder attaches to, solidifies and bonds to the edge electrode and the back electrode.

The adhesive compound is provided in contact with the edge electrode on the top surface of the pre-split board. The molten solder thus attaches to the edge electrode, and a portion of the molten solder runs along the edge electrode, wetting to the back electrode. As a result, the molten solder solidifies and bonds to the edge electrode and the back electrode.

The adhesive compound is provided in contact with the back electrode on the bottom surface of the pre-split board. The molten solder attaches to the back electrode, and a portion of the molten solder runs along the back electrode, reaching the edge electrode. As a result, the molten solder solidifies and bonds to the edge electrode and the back electrode.

The solid solder is placed onto the adhesive compound at a location corresponding to the edge electrode with the slit partially blocked. When the solid solder is heated, the molten solder enters into the through-hole, and reliably attaches to the edge electrode in the through-hole.

The adhesive compound is provided to the solid solder prior to or subsequent to the placement of the solid solder. The pre-split board and the remaining bare board are heated to melt the solid solder. The molten solder is cooled and solidified, bonding to the edge electrode and the back electrode. The bare board is then cut at the position of the slits to separate the pre-split board as the modular board. When the non-separate board is heated, the solid solder is melted while wetting to the edge electrode. A portion of the molten solder runs along the edge electrode, reaching the back electrode to wet to it. As a result, the solder solidifies and bonds to the edge electrode and the back electrode.

The solid solder partially blocks the opening of the slit at a location corresponding to the edge electrode, or is accommodated within the slit at a location corresponding to the edge electrode. The solid solder is held in position by the slit. When the solid solder is melted, the molten solder easily attaches to the edge electrode exposed in the slit.

The adhesive compound containing the oxide removal substance is provided in the vicinity of the through-hole. The solid solder is placed on the adhesive compound. The bare board is heated to melt the solid solder. The molten solder is cooled and solidified, thereby bonding to the edge electrode and the back electrode. The bare board is cut at the position of the through-hole using the diamond cutter. The modular board is thus easily separated from the bare board.

The back electrode and the edge electrode are removed from a portion of the bare board, which are included in the remaining bare board after cutting. The molten solder is prevented from sticking to the remaining bare board other than the modular board. When the bare board is cut to separate the modular board from the remaining bare board after the molten solder solidifies, no solder is cut.

The adhesive compound is the flux or the solder paste including the powdered solder and the flux, and the solid solder is the spherical solder ball which is solidified from the brazing alloy. With the flux or the solder paste, the solder ball is held in position and then solder fusing is expedited. When the flux is used, the volume of the molten solder ball is maintained, and the dimension of the bump from the bottom surface of the board remains constant. When the solder paste is used, the solder ball is melted together with the solder paste. The molten solder ball together with solder in the solder paste bonds to both the edge electrode and the back electrode.

While preferred embodiments have been described above, it is to be understood that modifications and changes will be apparent to those skilled in the art without departing from the spirit of the invention. The scope of the present invention is therefore to be determined solely by the appended claims.

What is claimed is:

1. A method for manufacturing a modular board comprising the steps of:

forming a through-hole in a bare board;

providing a back electrode surrounding the through-hole on the bottom surface of the bare board;

providing an edge electrode, connected to the back electrode, partially or entirely on the inner wall of the through-hole;

cutting the bare board along the through-hole to form a split board having the back electrode and the edge electrode, and a remaining bare board;

providing an adhesive compound containing an oxide removal substance on the periphery of the through-hole;

attaching solid solder to the adhesive compound;

heating the split board and the remaining bare board to melt the solid solder; and cooling and solidifying the molten solder on the edge electrode and the back electrode for bonding.

2. A method for manufacturing a modular board according to claim 1, further comprising the step of removing the back electrode on the bottom surface of a portion of the bare board becoming the remaining bare board and the edge electrode on the inner wall of the through-hole of the portion of the bare board becoming the remaining bare board, prior to the cutting of the bare board.

3. A method for manufacturing a modular board according to claim 1, wherein the adhesive compound is formed on the top surface of the split board and in contact with the edge electrode.

4. A method for manufacturing a modular board according to claim 1, wherein the adhesive compound is formed on the bottom surface of the split board and in contact with the back electrode.

5. A method for manufacturing a modular board according to claim 1, wherein the adhesive compound is formed in the vicinity of the through-hole on one of the top surface of and the bottom surface of the remaining bare board.

6. A method for manufacturing a modular board according to claim 1, wherein the solid solder is attached onto the adhesive compound with the through-hole blocked.

7. A method for manufacturing a modular board according to claim 1, wherein the adhesive compound is one of a flux and a solder paste including a powdered solder and a flux, and the solid solder is a substantially spherical solder ball which is solidified from a brazing alloy.

8. A method for manufacturing a modular board comprising the steps of:

providing a back electrode on the bottom surface of a bare board;

forming a through-hole in the bare board in the back electrode;

providing an edge electrode, connected to the back electrode, partially or entirely on the inner wall of the through-hole;

cutting the bare board along the through-hole to form a split board having the back electrode and the edge electrode, and a remaining bare board;

providing an adhesive compound containing an oxide removal substance on the periphery of the through-hole;

attaching solid solder to the adhesive compound;

heating the split board and the remaining bare board to melt the solid solder; and cooling and solidifying the molten solder on the edge electrode and the back electrode for bonding.

9. A method for manufacturing a modular board comprising the steps of:

forming a through-hole in a bare board;

providing a back electrode surrounding the through-hole on the bottom surface of the bare board;

providing an edge electrode, connected to the back electrode, partially or entirely on the inner wall of the through-hole;

cutting the bare board along the through-hole to form a split board having the back electrode and the edge electrode and a remaining bare board;

attaching solid solder onto the edge electrode;

providing an adhesive compound containing an oxide removal substance onto the solid solder prior to or subsequent to the attachment of the solid solder;

heating the split board and the remaining bare board to melt the solid solder; and cooling and solidifying the molten solder on the edge electrode and the back electrode for bonding.

10. A method for manufacturing a modular board according to claim 9, further comprising a step of removing the back electrode on the bottom surface of a portion of the bare board becoming the remaining bare board and the edge electrode on the inner wall of the through-hole of the portion of the bare board becoming the remaining bare board, prior to the cutting of the bare board.

11. A method for manufacturing a modular board according to claim 9, wherein the solid solder blocks the through-hole or is accommodated in the through-hole.

12. A method for manufacturing a modular board comprising the steps of:

providing a back electrode on the bottom surface of a bare board;

forming a through-hole in the bare board in the back electrode;

providing an edge electrode, connected to the back electrode, partially or entirely on the inner wall of the through-hole;

cutting the bare board along the through-hole to form a split board having the back electrode and the edge electrode and a remaining bare board;

attaching solid solder onto the edge electrode;

providing an adhesive compound containing an oxide removal substance onto the solid solder prior to or subsequent to the attachment of the solid solder;

heating the split board and the remaining bare board to melt the solid solder; and cooling and solidifying the molten solder on the edge electrode and the back electrode for bonding.

13. A method for manufacturing a modular board comprising the steps of:

forming a through-hole in a bare board;

providing a back electrode surrounding the through-hole on the bottom surface of the bare board;

providing an edge electrode, connected to the back electrode, on the inner wall of the through-hole;

partially removing the inner wall of the through-hole to make a slit to form a pre-split board including the edge electrode and the back electrode, the pre-split board being surrounded by the slit;

providing an adhesive compound containing an oxide removal substance on the periphery of the edge electrode;

attaching solid solder to the adhesive compound;

heating the pre-split board and the remaining bare board to melt the solid solder;

cooling and solidifying the molten solder on the edge electrode and the back electrode for bonding; and thereafter separating the pre-split board as the modular board from the bare board at the position of the slit.

14. A method for manufacturing a modular board according to claim 13, wherein the adhesive compound is formed on the top surface of the pre-split board and in contact with the edge electrode.

15. A method for manufacturing a modular board according to claim 13, wherein the adhesive compound is formed on the bottom surface of the pre-split board and in contact with the back electrode.

16. A method for manufacturing a modular board according to claim 13, wherein the solid solder is attached onto the adhesive compound at a location corresponding to the edge electrode with the slit partially blocked.

17. A method for manufacturing a modular board comprising the steps of:

providing a back electrode on the bottom surface of a bare board;

forming a through-hole in the bare board in the back electrode;

providing an edge electrode, connected to the back electrode, on the inner wall of the through-hole;

partially removing the inner wall of the through-hole to make a slit to form a pre-split board including the edge electrode and the back electrode, the pre-split board being surrounded by the slit;

providing an adhesive compound containing an oxide removal substance on the periphery of the edge electrode;

attaching solid solder to the adhesive compound, heating the pre-split board and the remaining bare board to melt the solid solder;

cooling and solidifying the molten solder on the edge electrode and the back electrode for bonding; and separating the pre-split board as the modular board from the bare board at the position of the slit.

18. A method for manufacturing a modular board comprising the steps of:

forming a through-hole in a bare board;

providing a back electrode surrounding the through-hole on the bottom surface of the bare board;

providing an edge electrode, connected to the back electrode, on the inner wall of the through-hole;

partially removing the inner wall of the through-hole to make a slit to form a pre-split board including the edge electrode and the back electrode, the pre-split board being surrounded by the slit;

attaching solid solder onto the edge electrode, providing an adhesive compound containing an oxide removal substance onto the solid solder prior to or subsequent to the attachment of the solid solder;

heating the pre-split board and the remaining bare board to melt the solid solder;

cooling and solidifying the molten solder on the edge electrode and the back electrode for bonding; and thereafter separating the pre-split board as the modular board from the bare board at the position of the slit.

19. A method for manufacturing a modular board according to claim 18, wherein the solid solder partially blocks the slit at a location corresponding to the edge electrode, or is accommodated within the slit at a location corresponding to the edge electrode.

20. A method for manufacturing a modular board comprising the steps of:

provided a back electrode on the bottom surface of a bare board;

forming a through-hole in the bare board in the back electrode;

providing an edge electrode, connected to the back electrode, on the inner wall of the through-hole;

removing partially the inner wall of the through-hole to make a slit to form a pre-split board including the edge electrode and the back electrode, the pre-split board being surrounded by the slit;

attaching solid solder onto the edge electrode, providing an adhesive compound containing an oxide removal substance onto the solid solder prior to or subsequent to the attachment of the solid solder;

heating the pre-split board and the remaining bare board to melt the solid solder;

cooling and solidifying the molten solder on the edge electrode and the back electrode for bonding; and thereafter separating the pre-split board as the modular board from the bare board at the position of the slit.

21. A method for manufacturing a modular board comprising the steps of:

forming a through-hole in a bare board;

providing a back electrode surrounding the through-hole on the bottom surface of the bare board;

providing an edge electrode, connected to the back electrode, partially or entirely on the inner wall of the through-hole;

providing an adhesive compound containing an oxide removal substance on the periphery of the through-hole;

attaching solid solder to the adhesive compound;

heating the bare board to melt the solid solder;

cooling and solidifying the molten solder on the edge electrode and the back electrode for bonding; and cutting the bare board at the position of the through-hole to separate the modular board.

22. A method for manufacturing a modular board according to claim 21, further comprising a step of removing the back electrode on the bottom surface of a portion of the bare board becoming the remaining bare board and the edge electrode on the inner wall of the through-hole of the portion of the bare board becoming the remaining bare board, prior to the providing of the adhesive compound.

23. A method for manufacturing a modular board comprising the steps of:

providing a back electrode on the bottom surface of a bare board;

forming a through-hole in the bare board in the back electrode;

providing an edge electrode, connected to the back electrode, partially or entirely on the inner wall of the through-hole;

providing an adhesive compound containing an oxide removal substance on the periphery of the through-hole;

attaching solid solder to the adhesive compound;

heating the bare board to melt the solid solder;

cooling and solidifying the molten solder on the edge electrode and the back electrode for bonding; and cutting the bare board at the position of the through-hole to separate the modular board.

* * * * *